United States Patent
Seo et al.

(10) Patent No.: US 7,567,031 B2
(45) Date of Patent: *Jul. 28, 2009

(54) ORGANIC LIGHT EMITTING ELEMENT AND LIGHT EMITTING DEVICE USING THE ELEMENT

(75) Inventors: Satoshi Seo, Kanagawa (JP); Masakazu Murakami, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 284 days.

This patent is subject to a terminal disclaimer.

(21) Appl. No.: 11/716,004

(22) Filed: Mar. 9, 2007

(65) Prior Publication Data

US 2007/0159079 A1 Jul. 12, 2007

Related U.S. Application Data

(62) Division of application No. 10/158,233, filed on May 31, 2002, now Pat. No. 7,199,515.

(30) Foreign Application Priority Data

| Jun. 1, 2001 | (JP) | ............................ 2001-167508 |
| Jun. 4, 2001 | (JP) | ............................ 2001-167662 |

(51) Int. Cl.
*H01J 1/62* (2006.01)
*B01J 63/04* (2006.01)

(52) U.S. Cl. ...................... 313/506; 313/504; 313/509; 428/917; 428/690

(58) Field of Classification Search .............. 313/504, 313/506, 509; 428/917, 690

See application file for complete search history.

(56) References Cited

U.S. PATENT DOCUMENTS 4,684,353 A 8/1987 deSouza (Continued)

FOREIGN PATENT DOCUMENTS

EP 0 880 303 A1 11/1998

(Continued)

OTHER PUBLICATIONS

D.F. O'Brien et al. "Improved Energy Transfer in Electrophosphorescent Devices"; Appl. Phys. Lett. vol. 74, No. 3, pp. 442-444, Jan. 18, 1999.

(Continued)

*Primary Examiner*—Peter Macchiarolo
(74) *Attorney, Agent, or Firm*—Nixon Peabody LLP; Jeffrey L. Costellia

(57) ABSTRACT

An organic light emitting element which can employ non-sublimable (non-volatile) or insoluble materials while keeping the same level of light emission as prior art is provided. Dispersive particles (202*a*) of an insoluble organic material that is dispersed in a solvent (201) in which a soluble organic material (203*a*) is dissolved is applied to a substrate (200) that has an electrode. Then, the solvent (201) is vaporized by heat treatment to form a uniform film (203*b*) of the soluble organic material in which aggregations (clusters) of the insoluble organic material are scattered. Since the soluble organic material film (203*b*) is thoroughly uniform. defects such as breakdown can be avoided to make it a fully functional organic light emitting element.

38 Claims, 21 Drawing Sheets

U.S. PATENT DOCUMENTS

| | | | |
|---|---|---|---|
| 4,775,820 | A | 10/1988 | Eguchi et al. |
| 5,036,249 | A | 7/1991 | Pike-Biegunski et al. |
| 5,346,772 | A | 9/1994 | Akiyama et al. |
| 5,518,825 | A | 5/1996 | Murayama et al. |
| 5,674,597 | A | 10/1997 | Fujii et al. |
| 5,739,635 | A | 4/1998 | Wakimoto |
| 5,756,224 | A | 5/1998 | Borner et al. |
| 5,895,692 | A | 4/1999 | Shirasaki et al. |
| 6,287,712 | B1 | 9/2001 | Bulovic et al. |
| 6,307,528 | B1 | 10/2001 | Yap |
| 6,469,439 | B2 | 10/2002 | Himeshima et al. |
| 6,558,817 | B1 | 5/2003 | Ueda et al. |
| 6,580,213 | B2 | 6/2003 | Yamazaki |
| 6,830,494 | B1 | 12/2004 | Yamazaki et al. |
| 6,831,406 | B1 | 12/2004 | Fukuyama et al. |
| 7,179,756 | B2 | 2/2007 | Yamazaki |
| 2001/0017409 | A1 | 8/2001 | Hiroki et al. |
| 2002/0031874 | A1 | 3/2002 | Yamazaki et al. |
| 2002/0034655 | A1 | 3/2002 | Watanabe et al. |
| 2002/0121860 | A1 | 9/2002 | Seo et al. |
| 2002/0187567 | A1 | 12/2002 | Yamazaki et al. |
| 2003/0209974 | A1 | 11/2003 | Yamazaki |
| 2005/0035708 | A1 | 2/2005 | Yamazaki et al. |
| 2005/0056969 | A1 | 3/2005 | Ghosh et al. |

FOREIGN PATENT DOCUMENTS

| | | |
|---|---|---|
| EP | 1 128 449 A2 | 8/2001 |
| EP | 1 132 980 A2 | 9/2001 |
| JP | 10-12377 A | 1/1998 |
| JP | 10-153967 A | 6/1998 |
| JP | 10-270169 | 10/1998 |
| JP | 2001-257076 | 9/2001 |
| JP | 2001-297876 A | 10/2001 |
| JP | 2001-345176 A | 12/2001 |
| JP | 2001-345177 A | 12/2001 |

OTHER PUBLICATIONS

Tokito et al., "*Organic EL Devices Using Novel Metal Complexes*", Monthly Display Special Issue, Organic EL Display-Basics to the Latest News, pp. 98-99, Oct. 20, 1998 & English Translation (Full).

C.W. Tang et al. "Organic Electroluminescent Diodes"; Appl. Phys. Lett. vol. 51, No. 12, pp. 913-915, Sep. 21, 1987.

U.S. Appl. No. 09/580,485, filed May 30, 2000 (756-2154).

Tsutsui et al., "Electroluminescence in Organic Thin Films", Photochemical Processes in Organized Molecular Systems, 1991, pp. 437-450 (Elsevier Science Publishers, Tokyo, 1991).

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Tsutsui et al., "High Quantum Efficiency in Organic Light-Emitting Devices with Idrium-Comolex as a Triplet Emissive Center", Japanese Journal of Applied Physics vol. 38, Part 12B, Dec. 15, 1999, pp. L1502-L1504.

Lee. C et al., "Polymer Phosphorescnet Light-Emitting Devices Doped With Tris (2-Phenylpyridine) Iridium as a Triplet Emitter", Appl. Phys. Lett. (Applied Physics Letters), Oct. 9, 2000, vol. 77, No. 15, pp. 2280-2282.

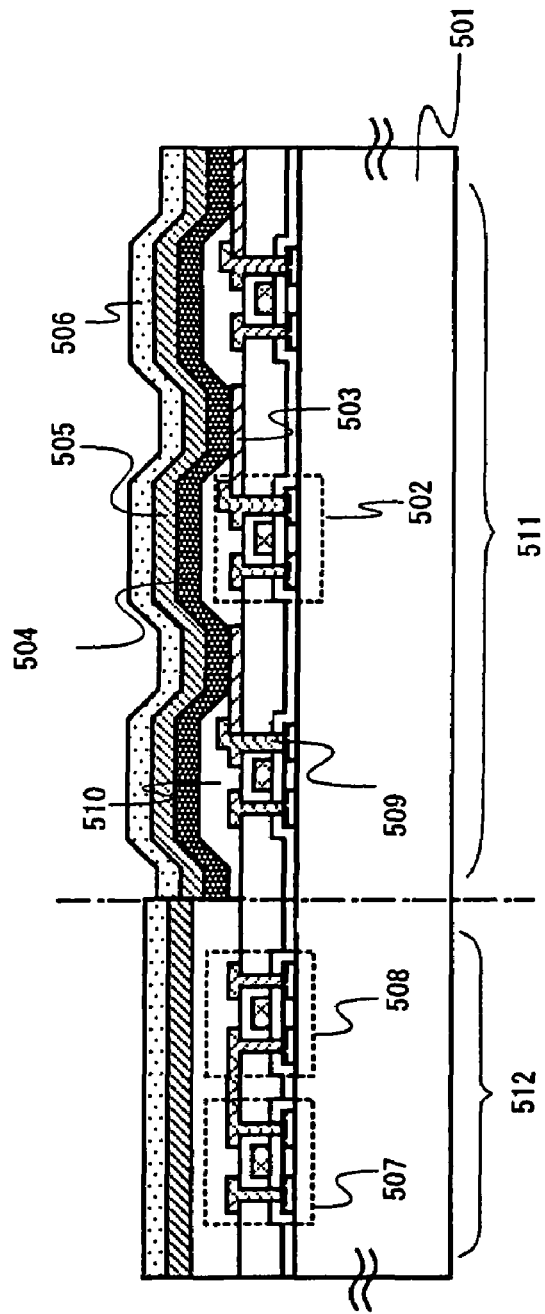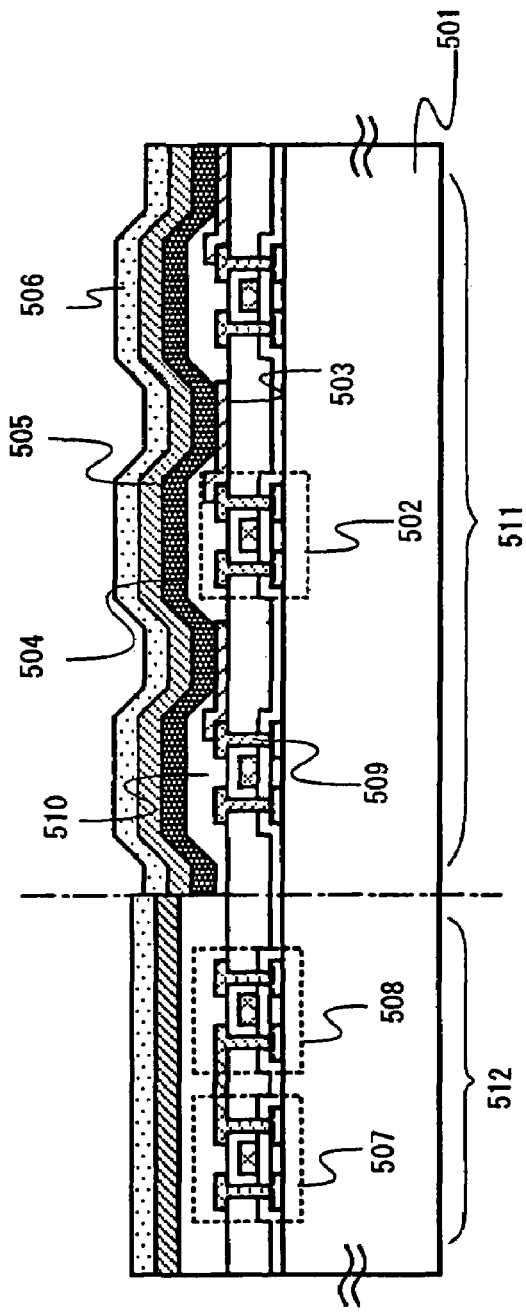

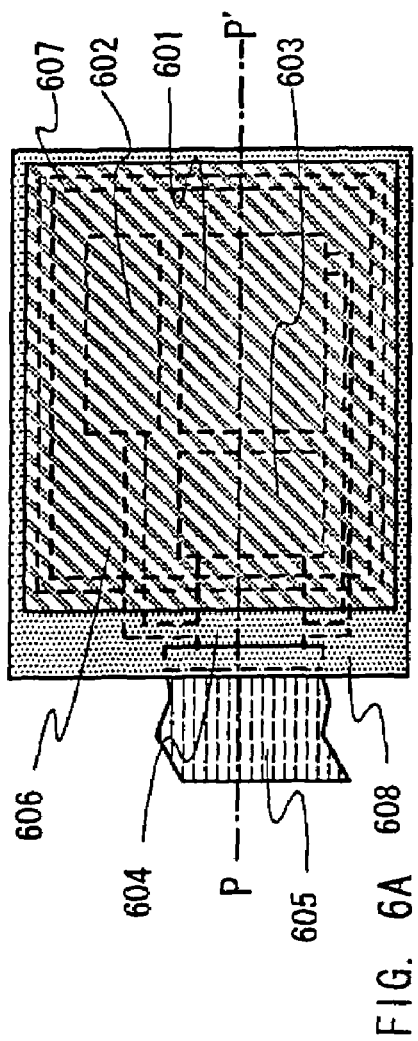
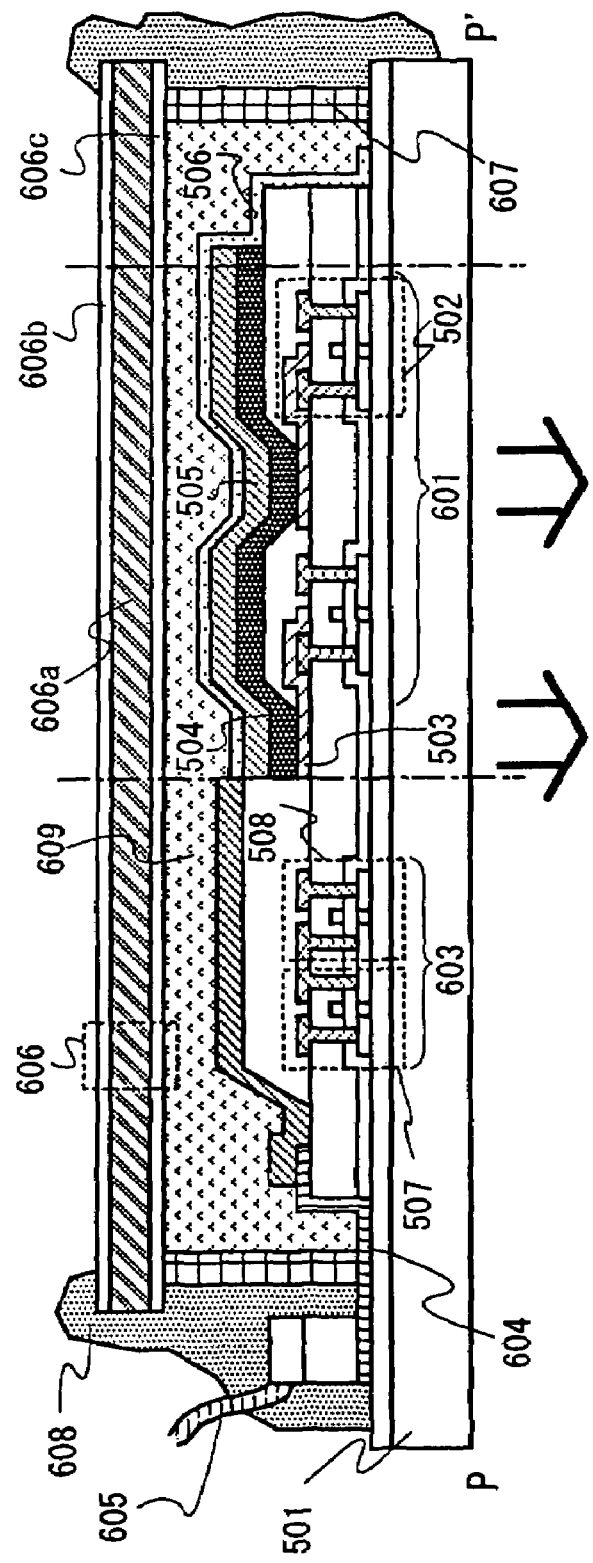
FIG. 6A
FIG. 6B

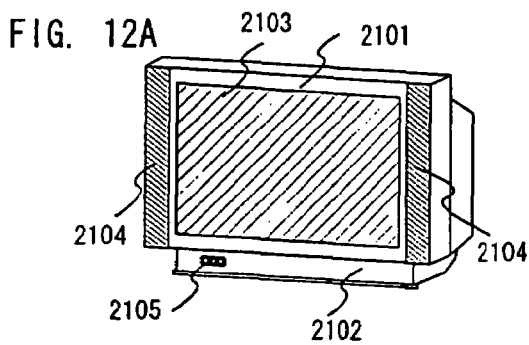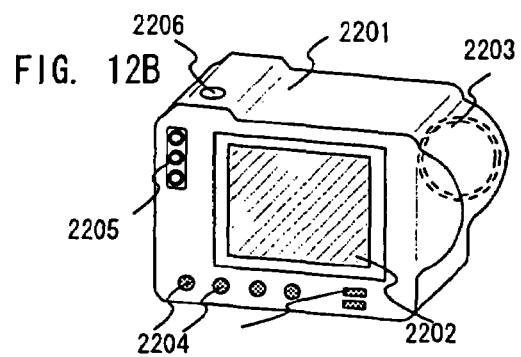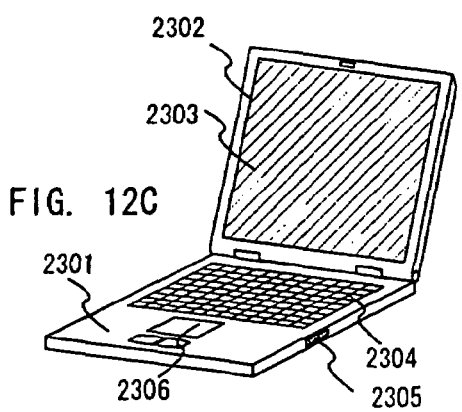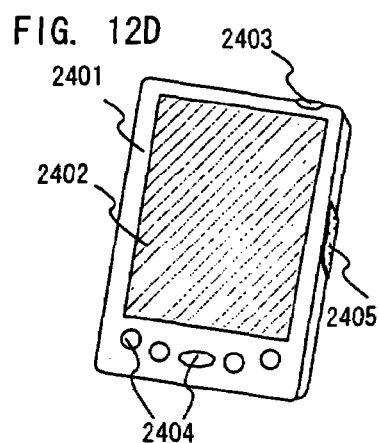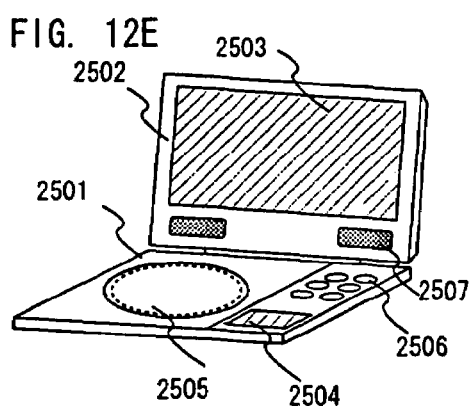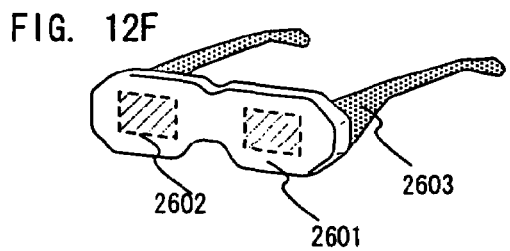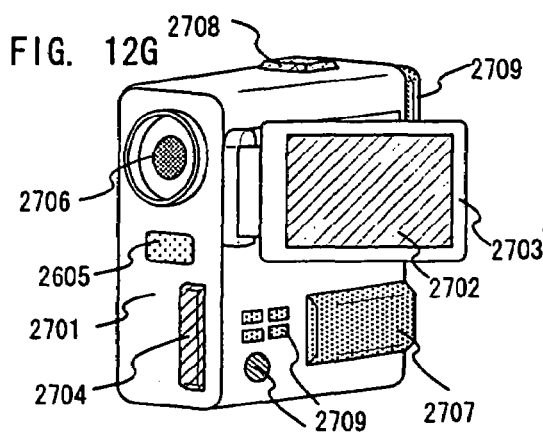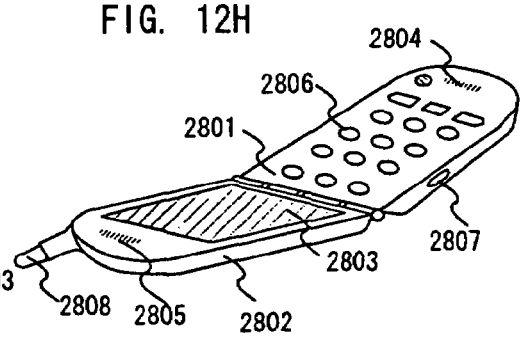

ORGANIC LIGHT EMITTING ELEMENT AND LIGHT EMITTING DEVICE USING THE ELEMENT

This application is Divisional of U.S. application Ser. No. 10/158,233 filed May 31, 2002 now U.S. Pat. No. 7,199,515.

BACKGROUND OF THE INVENTION

1. Field of the Invention

The present invention relates to an organic light emitting element having an anode, a cathode, and a layer that contains an organic compound capable of emitting light upon application of electric field (the layer hereinafter referred to as organic compound layer), and to a light emitting device using the element. Specifically, the present invention relates to an organic light emitting element that has a wider choice of materials than before while keeping the same level of light emission as prior art. In this specification, the term light emitting device refers to an image display device or a light emitting device that uses an organic light emitting element for its light emitting element. Also, the following modules are all included in the definition of the light emitting device: a module obtained by attaching to an organic light emitting element a connector such as an anisotropic conductive film (FPC: flexible printed circuit), a TAB (tape automated bonding) tape, or a TCP (tape carrier package); a module in which a printed wiring board is provided at an end of a TAB tape or a TCP; and a module in which an IC (integrated circuit) is directly mounted to an organic light emitting element by the COG (chip on glass) method.

2. Description of the Related Art

Organic light emitting elements are elements that emit light upon application of electric field. It is said that organic light emitting elements emit light through the following mechanism: a voltage is applied between electrodes that sandwich an organic compound layer, electrons injected from the cathode and holes injected from the anode are re-combined in the organic compound layer to form excited molecules (hereinafter referred to as molecular excitons); and the molecular excitons return the base state while releasing energy to cause the organic light emitting element to emit light.

Molecular excitons generated in organic compounds take either singlet excitation or triplet excitation. This specification deals with elements that emit light from singlet excitation and elements that emit light from triplet excitation both.

In an organic light emitting element as above, its organic compound layer is usually a thin film having a thickness of less than 1 μm. In addition the organic light emitting element does not need back light used in conventional liquid crystal displays because it is a self-luminous element and the organic compound layer itself emits light. The organic light emitting element is therefore useful in manufacturing a very thin and light-weight display device, which is a great advantage.

When the organic compound layer is 100 to 200 nm in thickness, for example. recombination takes place within several tens nanoseconds since carriers are injected based on the mobility of carriers in the organic compound layer and counting the process from carrier recombination to light emission in, the organic light emitting element is readied for light emission in microseconds. Accordingly, fast response is also one of the features of the organic light emitting element.

Since the organic light emitting element is of carrier injection type, it can be driven with direct-current voltage and hardly emits noises. Regarding driving voltage a report says that a sufficient luminance of 100 cd/m$^2$ is obtained at 5.5 V by using a very thin film with a uniform thickness of about 100 nm for the organic compound layer, choosing an electrode material capable of lowering a carrier injection barrier against the organic compound layer, and introducing the hetero structure (two-layered structure) (Reference 1: C. W. Tang and S. A. VanSlyke, "Organic electroluminescent diodes", Applied Physics Letters, vol. 51, no. 12, 913-915 (1987)).

Organic light emitting elements are drawing attention as the next-generation flat panel display elements for their characteristics including being thin and light-weight, fast response, and direct current low voltage driving. Also being self-luminous and having wide viewing angle give the organic light emitting elements better visibility. Therefore, the organic light emitting elements are considered as effective elements for display screens of portable equipment.

These EL display devices are divided by driving methods into passive type (simple matrix type) and active type (active matrix type) and both types have been developed actively. Recently, efforts for developing EL display devices are centered around active matrix EL display devices that have active elements such as thin film transistors (TFTs) in their pixel portions.

Organic compound materials used in EL elements are classified into two types is namely, low molecular weight organic compound materials (hereinafter referred to as low molecular weight materials) and high molecular weight organic compound materials (hereinafter referred to as high molecular weight materials). Usually, these organic compound materials individually form one layer of amorphous thin film in an EL element. In other words, an EL element has a single layered structure consisting of one thin film, or has a multi-layered structure having plural thin films of different materials. In the case of the multi-layered structure, there is an interface wherever two organic thin films meet (hereinafter referred to as organic interface). The term thin film includes a thin film consisting of a single material and a thin film composed of plural materials. In the latter, a material serving as a host is doped (molecular dispersion) with a single or plural materials and this host-guest system is important. Each layer is several nm to several hundreds nm in thickness.

There is a carrier (holes and electrons) injection barrier in each organic interface between two organic thin films that are in contact with each other. The barrier for electrons is the energy difference in LUMO (lowest unoccupied molecular orbital) whereas the barrier for holes is the energy difference in HOMO (highest occupied molecular orbital). In addition, different kinds of organic thin films have different thermal and electric properties to reduce adhesion between the films. This may cause one of the films to peel off the other at the organic interface when the EL element is driven. From the reasons above, a desirable EL element is structured so as to have less organic interfaces.

When a low molecular weight material is formed into a film, vacuum evaporation is employed in most cases. An advantage of vacuum evaporation is that the conventional shadow mask technique can be used to pattern the formed film. Vacuum evaporation is also advantageous in that the purity of the material can be kept because it is dry process in vacuum.

However, vacuum evaporation also has problems and the biggest one regarding materials is that it cannot form a material into a film unless the material is volatile (or sublimable). In other words, vacuum evaporation cannot employ a material that is decomposed instead of being evaporated when heated no matter what the material has excellent light emission characteristics and carrier transporting characteristics.

When forming an organic compound layer from a low molecular weight material by vacuum evaporation, co-evaporation is often used to dope the material with a minute amount of pigment. It is technically difficult to achieve co-evaporation of a host material and a plurality of dopants simultaneously at a constant rate and this is another drawback of forming a low molecular weight organic compound layer by evaporation.

On the other hand high molecular weight materials can be formed into films by several methods. For example, spin coating can be employed if the high molecular weight material is soluble and used in the form of solution. Although it has a drawback of wasting about 95% of the material prepared spin coating is easy to obtain a large area light emitting element if the element emits light of one color using a single substance. Spin coating is also easy to dope the host with a plurality of dopants simultaneously if the solutions are adjusted in advance.

Under current circumstances, high molecular weight materials are dissolved in solvents for wet film-forming. This means that the high molecular weight materials have to be soluble in solvents. In short, a drawback of forming a high molecular weight organic compound layer by wet film-forming is that usually a material that is insoluble in a solvent cannot be used. Furthermore, it is difficult to obtain a thin film of high purity by wet film-forming.

Also, $\pi$ conjugate polymers used in organic light emitting elements generally have small flexibility in $\pi$ conjugate principal chain and have almost no solubility in solvents. It is therefore popular to introduce alkyl base, alkoxy base, or the like as a side chain in order to improve their solubility.

However, introduction of substituent brings about a problem of a change in color of light emitted from the compound. For instance, an organic compound material expressed as poly(1,4-phenylene vinylene) (hereinafter referred to as PPV) emits green light whereas an organic compound material which is obtained by introducing alkoxy base to PPV in order to improve the solubility and which is expressed as poly(2,5-dialkoxy-1,4-phenylene vinylene) (hereinafter referred to as RO-PPV) emits orange light.

Introduction of substituent (especially one that has strong electron absorption/donation power) may also lower the light emission efficiency of an organic light emitting element. This applies not only to high molecular weight materials but to organic compounds in general (Reference 2: Seiji Tokito, Hiromitsu Tanaka, Yasunori Taga, "Monthly Display Special Issue: Organic EL Display. Basics to the Latest News", Techno Times Co., Ltd., pp. 98-99). Therefore, introduction of substituent as a measure to increase the solubility often leads to negative results in terms of light emission characteristics.

Furthermore, introduction of substituent means addition of a synthesizing step which makes it difficult to manufacture the material at low cost.

As has been described, organic materials used in organic light emitting elements have to be volatile (sublimable) or soluble and, because of this restriction, an advantage of organic materials, namely, a wide choice of materials is not fully utilized under the present circumstances. Also, in wet film-forming, improvement of if solubility by introduction of a substituent cannot be achieved without lowering the light emission efficiency and increasing the manufacture cost.

SUMMARY OF THE INVENTION

The present invention has been made in view of the above and an object of the present invention is therefore to provide an organic light emitting element which can employ non-volatile (non-sublimable) or insoluble materials while keeping the same level of light emission as prior art. By achieving this object, a wider choice of materials is presented and organic light emitting elements varied in color of emitted light can be manufactured at low cost.

Another object of the present invention is to use this organic light emitting element to provide a light emitting device that can emit light in more colors at less expensive cost than prior art. Still another object of the present invention is to provide an electric appliance using the light emitting device.

One of methods to apply an organic material that has no solubility (hereinafter referred to as insoluble organic material) to form it into a film is to utilize a dispersion medium. In this method, instead of dissolving an organic material, the organic material is dispersed in the form of granules that are masses of molecules (hereinafter referred to as dispersive particles) in a dispersion medium. This dispersion solution is applied to a substrate and then the dispersion medium is vaporized by heat treatment to form a film of the organic material.

However, if an insoluble organic material alone is dispersed in a dispersion medium, the film formed of the dispersive particles after vaporizing the dispersion medium by heat treatment is not uniform. The concept thereof is illustrated in FIGS. 1A and 1B.

FIG. 1A is a diagram schematically showing application of dispersive particles 102 dispersed in a dispersion medium 101 to a substrate 100. If the dispersion medium 101 is vaporized by heat treatment after the application, the film formed has many defects 103 as shown in FIG. 1B. In other words, a uniform amorphous film cannot be obtained and, if this film is used in an organic light emitting element defects such as breakdown takes place to make it impossible for the element to function.

In order to solve this, the present inventors have thought of simultaneously employing an insoluble organic material and a soluble organic material when forming by wet film-forming a film that contains two or more kinds of organic materials. This method is successful in obtaining a uniform film. The concept thereof is illustrated in FIGS. 2A and 2B. In the example shown in FIGS. 2A and 2B, one insoluble organic material and one soluble organic material are used.

FIG. 2A is a diagram schematically showing application to a substrate 200 of dispersive particles 202a of an insoluble organic material dispersed in a solvent 201 in which a soluble organic material 203a is dissolved. If the solvent 201 is vaporized by heat treatment after the application, a uniform film 203b is formed from the soluble organic material and aggregations (clusters) 202b formed of the insoluble organic material are scattered in the film 203b as shown in FIG. 2B. The film 203b is thoroughly uniform and therefore can avoid defects such as breakdown to make it possible to function as an organic light emitting element. Needless to say the thickness of the film has to be larger than the diameter of the aggregations.

When an insoluble organic material and a soluble organic material are used together in accordance with the present invention, the element obtained is characterized by aggregations (clusters) scattered in a uniform amorphous film as described above. Therefore, according to the present invention an organic light emitting element having an organic compound layer between an anode and a cathode, the organic compound layer including a mixed layer that is composed of two or more kinds of organic compounds serving as host and guest materials is characterized in that one or more kinds of organic compounds that serve as the host material form a uniform amorphous film and that the guest material forms an aggregation having a diameter smaller than the thickness of the mixed layer.

In the present invention, substantially, an organic compound soluble in an organic solvent is employed as a host material whereas an organic compound insoluble in the organic solvent is employed as a guest material. Therefore, the organic light emitting element of the present invention is characterized in that one or more of the organic compounds that serve as the host material are soluble in an organic solvent and the guest material is insoluble in the organic solvent. Preferably, soluble organic materials used as the host material are soluble high molecular weight materials.

As described before, introduction of substituent to a light emitting material often lowers light emission characteristics although the substituent increases the solubility. However, the present invention does not need to increase the solubility because an insoluble light emitting material can be used as it is in the present invention. The feature of the present invention is therefore an increased choice of light emitting materials. Accordingly, a light emitting material can be used as a guest material in the present invention.

In recent years, viewed in the light emission efficiency, organic light emitting elements capable of converting energy released upon return to the base state from triplet excitation (hereinafter referred to as triplet excitation energy) into light emission are attracting attention for their high light emission efficiency (Reference 3: D. F. O'Brien, M. A. Baldo, M. E. Thompson and S. R. Forrest, "Improved energy transfer in electrophosphorescent devices", Applied Physics Letters, vol. 74, no. 3, 442-444 (1999) (Reference 4: Tetsuo TSUTSUI, Moon-Jac YANG, Masayuki YAHIRO, Kenji NAKAMURA, Teruichi WATANABE. Taishi TSUJI, Yoshinori FUKUDA, Takeo WAKIMOTO and Satoshi MIYAGUCHI, "High Quantum Efficiency in Organic Light-emitting Devices with Iridium Complex as a Triplet Emissive Center", Japanese Journal of Applied Physics, vol. 38, L1502-L1504 (1999)).

Reference 3 uses a metal complex having platinum as its central metal whereas Reference 4 uses a metal complex having metal iridium as its central. These organic light emitting elements that can convert triplet excitation energy into light emission (hereinafter referred to as triplet light emitting element) can reach higher in luminance and light emission efficiency than conventional ones.

However, materials that can convert triplet excitation energy into light emission (hereinafter referred to as triplet light emitting materials) are limited to organic metal complexes of heavy metals at present and there are not many to choose. When the volatility (sublimableness) and solubility are added to this limitation, the choice of materials is further narrowed to give only limited capacity to the triplet light emitting elements. In addition, it allows only limited variations in color of light emitted from the elements.

The above problem can be solved by applying the present invention to triplet light emitting elements. Accordingly, a triplet light emitting material can be used as a guest material in the present invention.

BRIEF DESCRIPTION OF THE DRAWINGS

In the accompanying drawings:

FIGS. 5A and 5B are diagrams showing the sectional structure of a light emitting device:

FIGS. 6A and 6B are diagrams respectively showing the top structure of a light emitting device and the sectional structure thereof;

FIGS. 12A to 12H are diagrams showing specific examples of an electric appliance;

DETAILED DESCRIPTION OF THE PREFERRED EMBODIMENTS

Embodiment Mode

First, a solution is prepared by dissolving one or more kinds of soluble organic compounds (hereinafter referred to as host materials) into a solvent. The solution has to be one that can form a uniform amorphous thin film of the organic compounds by wet film-forming such as application, extrusion, and ejection.

Next, one or more kinds of organic compounds that are insoluble in the solvent (hereinafter referred to as guest materials) are dispersed in the solution to obtain a mixture (hereinafter referred to as dispersion solution). At least one of the dispersed organic compounds emits fluorescent light or phosphorescent light.

Figure 14A:
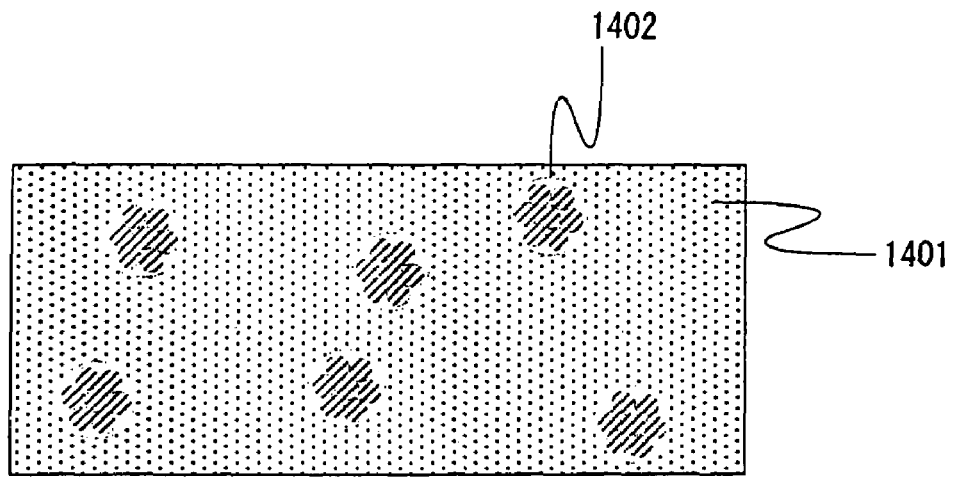
FIGS. 14A to 14C are diagrams showing the concept of the present invention.

The dispersion solution is formed into a film by wet film-forming to obtain a layer of the uniform amorphous thin film of the host material in which coupled molecules of the guest material form granules to be scattered (the layer is hereinafter referred to as light emitting layer). The concept thereof is illustrated in FIG. 14A. In the drawing, granules 1402 composed of guest material molecules are scattered in a uniform amorphous thin film 1401 of the host material.

Figure 14B:
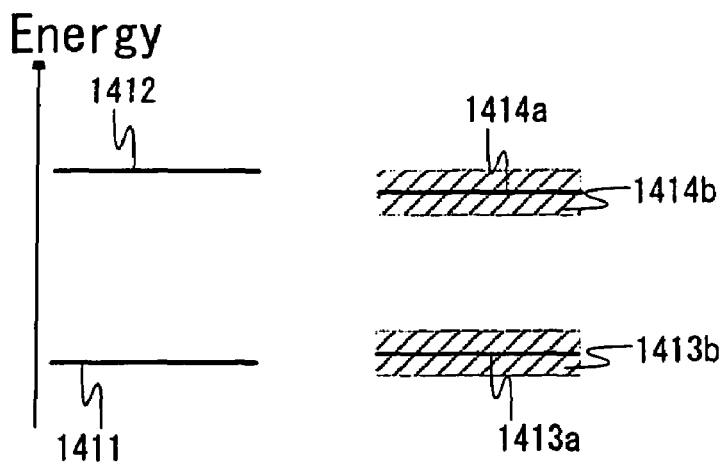

There are two light emission processes possible. In one process, electrons and holes injected into the light emitting layer are re-combined in the host material to excite the host material, excitation energy thereof is transmitted to the guest material to excite the guest material in turn, and the guest material returns to the base state to emit light. In order to run this process efficiently, the difference in excitation energy between the host material and the guest material has to be small. The concept thereof is illustrated in FIG. 14B. To elaborate, the energy difference between HOMO 1411 and LUMO 1412 of the host material has to be close to the energy difference between HOMO 1413a and LUMO 1414a of the guest material. This is where the light emitting layer of the present invention has the potential of improving light emission efficiency. In the present invention, a few guest material molecules aggregate to form a granule and levels 1413b and 1414b are formed in the granule to have a wider energy range than in a single guest material molecule. This gives the excitation energy in the guest material molecules a wider range. Therefore, the difference in excitation energy between the host material and the guest material can be reduced and light emission from the guest material can be obtained more efficiently.

Figure 14C:
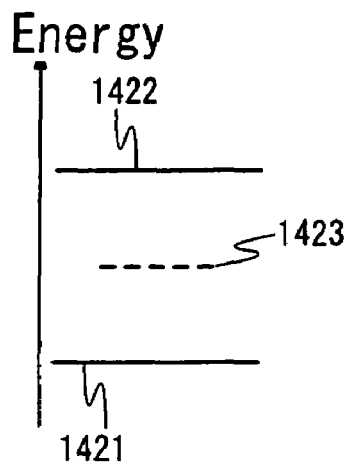

The other light emission process involves recombination of electrons and holes that have been injected into the light emitting layer. This recombination takes place directly in the guest material to excite the guest materials which then returns to the base state to emit light. In order to run this process efficiently, the guest material has to be capable of trapping both of carriers, holes and electrons, with ease. The light emitting layer of the present invention finds the potential of improving light emission efficiency also in this point. The concept thereof is illustrated in FIG. 14C. Granules of the guest material in the uniform amorphous thin film of the host material can be deemed as a sort of impurity, which forms a sort of 'impurity' level 1423 between HOMO 1421 and LUMO 1422 of the host material. Both the carriers are trapped by this level. In physical space, both the carriers are confined in the granules. Therefore the present invention can obtain light emission by recombination of carriers in granules more efficiently.

Which of the two processes described above is dominant depends on the diameter of the granules, the concentration and distribution of the granules in the host material, and the like. In either case, the light emitting layer according to the present invention can improve EL emission efficiency.

Therefore, according to the present invention, a light emitting element with an organic compound layer sandwiched between an anode and a cathode, the organic compound layer containing plural kinds of organic compounds is characterized in that: the organic compound layer is composed of one or more kinds of organic compounds that form a uniform amorphous film, and one or more kinds of organic compounds that are scattered in the amorphous film in the form of granule having a diameter smaller than the thickness of the organic compound layer; and that at least one of the organic compounds that form the uniform amorphous film is soluble in a solvent whereas at least one of the organic compounds scattered in the form of granule is insoluble in the solvent.

A guest material in the present invention can be one that emits fluorescent light or one that emits phosphorescent light. The present invention includes both types of EL emission, namely, fluorescent light emission and phosphorescent light emission.

In order to obtain EL emission at a voltage low enough to be practical, the electric field intensity necessary for EL emission has to be secured by reducing the thickness of the organic compound layer. Therefore the organic compound layer of the present invention is equal to or more than 1 nm thick and equal to or less than 1 μm thick.

An embodiment mode of the present invention will be described below. Of an anode and cathode of an organic light emitting element, at least one is transparent to take the emitted light out. In this embodiment mode, a transparent anode is formed on a substrate to take out light through the anode. However, the present invention is applicable to an element structure in which light is taken out through the cathode and to an element structure in which light is taken out from the opposite side of the substrate.

In carrying out the present invention, manufacture of an organic light emitting element basically employs a wet film-forming method. The following are how an organic light emitting element of the present invention is manufactured by some of wet film-forming methods.

Figure 2A:
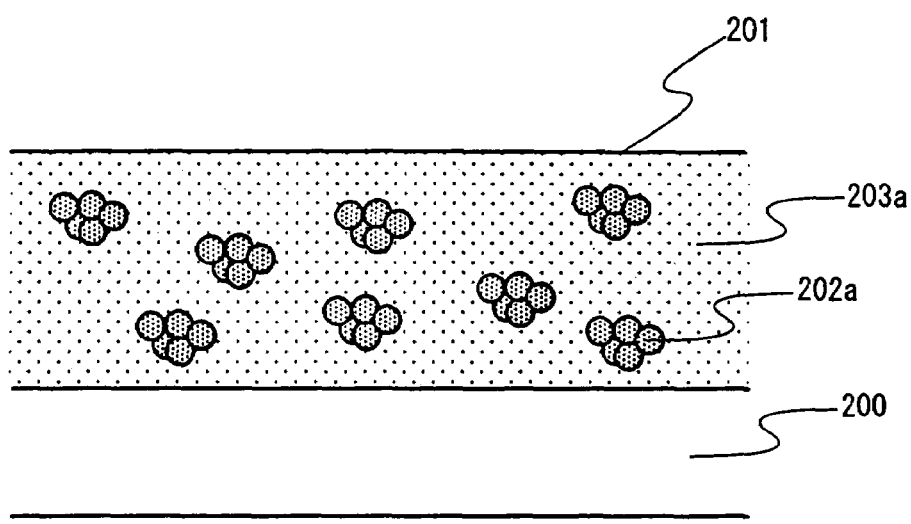
FIGS. 2A and 2B are diagrams showing film formation by dispersive particles.
Figure 2B:
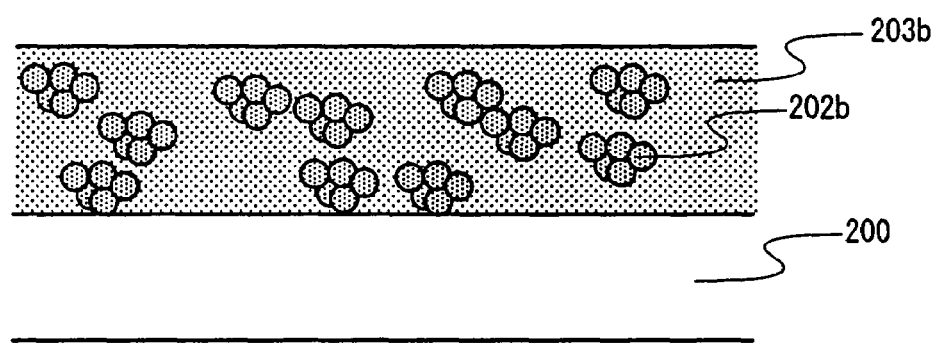

The most typical wet film-forming method that can be used in the present invention is dip coating or spin coating. In this method, an insoluble organic material is dispersed in a solvent in which a soluble organic material is dissolved is prepared (hereinafter referred to as dispersion solution) as shown in FIGS. 2A and 2B. After the film is formed by conventional dip coating or spin coating, the solvent is removed by heating.

The wet film-forming method above is a simple method and therefore can lower the cost. This makes it an effective method for manufacture of organic light emitting elements that emit light of one color.

In the wet film-forming method such as dip coating and spin coating, the technique for patterning intricate and fine patterns has room for improvement and a patterning technique using inkjet has been studied and developed recently (Reference 5: JP 10-012377 A) (Reference 6: JP 10-153967 A). The ink jet method makes it possible to pattern an organic compound with high accuracy and to pattern a wide area. Therefore the inkjet method is deemed as an effective method in manufacturing a large area light emitting device of high definition. Reference 5 and Reference 6 are both successful in obtaining a full-color active matrix display.

This ink jet method can be used to manufacture an organic light emitting element of the present invention. When employing the ink jet method, the dispersion solution serves as ink to pattern pixels. In this case, the diameter of the ink jet nozzle has to be well larger than the diameter of the dispersive particles of the insoluble organic material.

Figure 3A:
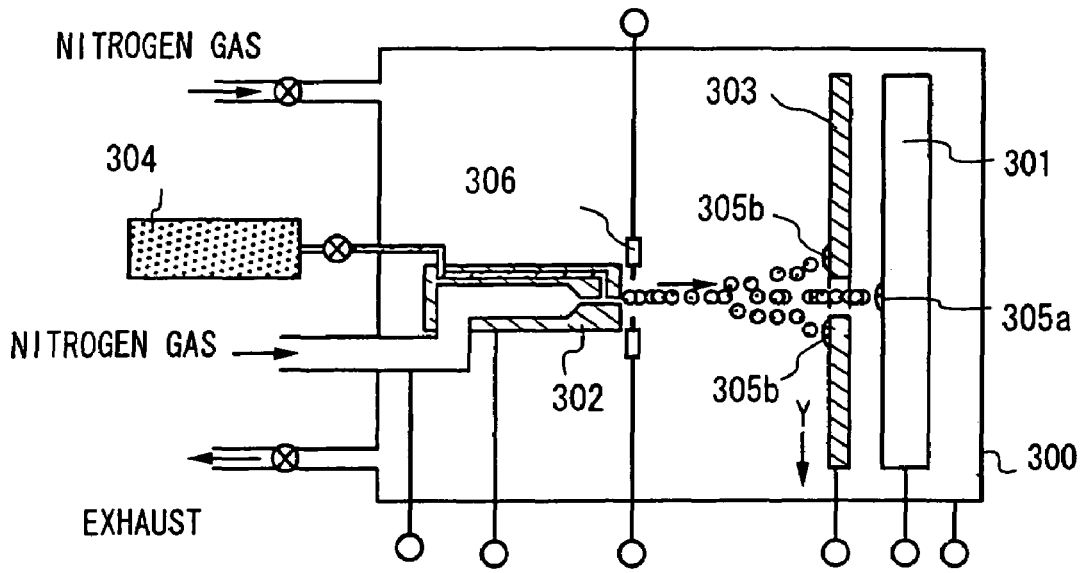
FIGS. 3A to 3C are diagrams showing examples of apparatus for manufacturing an organic light emitting element.

A particularly preferred film formation method is spraying in which a sprayer is used for minute patterning and which is simple and costs less. FIG. 3A illustrates a simplified version of this method.

In FIG. 3A, a substrate 301, a mask 303, and a nozzle 302 are arranged in a chamber 300. The tip of the nozzle 302 is directed to the substrate side. The atmosphere in the chamber 300 is controlled to have inert gas atmosphere (here nitrogen atmosphere). A container is placed apart from the chamber 300 and holds a dispersion solution 304 therein.

The nozzle 302 is connected to a pipe extending from a carrier gas inlet and is connected to a pipe extending from the container that holds the dispersion solution 304. When carrier gas (here, nitrogen gas) is caused to flow toward the tip of the nozzle, the dispersion solution 304 in the container moves out of the container utilizing the difference in pressure (difference between the pressure at the middle of the nozzle and the pressure at the tip of the nozzle) and the difference in flow rate in accordance with Bernoulli's theorem. The solution 304 forms mist together with the gas to be ejected (sprayed) from the nozzle. The nozzle capable of ejecting is called a spray gun. The dispersion solution 304 is a viscous liquid that can be ejected from the nozzle 302. The carrier gas is inert gas such as nitrogen, argon, helium, and neon. Although not shown in the drawings, a device for controlling the flow rate of the carrier gas is provided. A device for controlling the flow rate of the dispersion solution 304 may be added. The mask 303 is placed between the nozzle and the substrate in order to selectively form a layer 305a containing an organic compound. If the layer is to be formed on the entire surface instead, the mask 303 is not necessary.

In another ejection method, the liquid is moved out of the container using a compressed gas source (not shown) and the carrier gas is caused to flow toward the tip of the nozzle so that a mixture of the liquid and the gas is sprayed in the chamber. Since the components required in this method are obvious, a drawing to illustrate details thereof is omitted here. A device for controlling the flow rate of the liquid may be added.

Figure 3B:
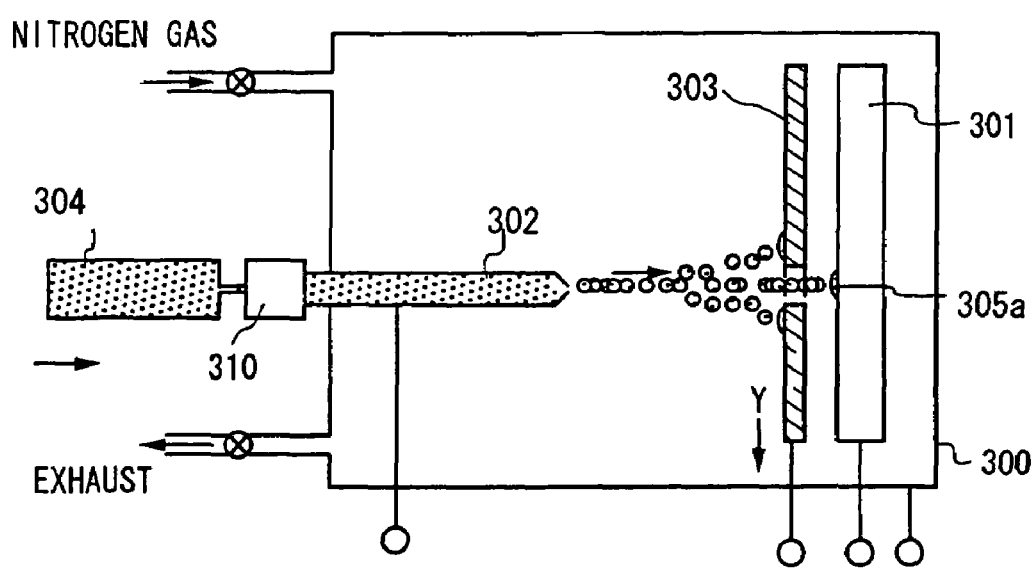

Still another ejection method is shown in FIG. 3B. The pressure in the pipe from the container to the nozzle is increased by a compressor pump 310 or the like to cause the liquid to flow toward the tip of the nozzle and to spray the liquid alone in the chamber.

Figure 3C:
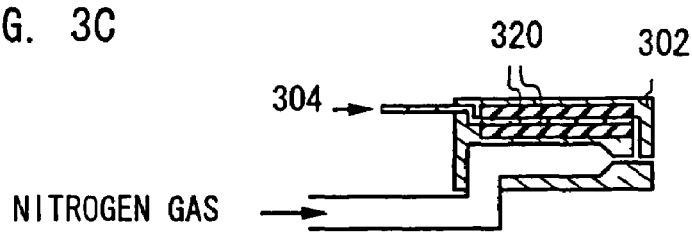

It is preferred for the organic compound to be uniformly dispersed in the liquid. As shown in FIG. 3C, the liquid may be shaken by shaking the nozzle 302 itself in the pipe that connects the container and the tip of the nozzle using ultrasound shaking means 320. Alternatively, the container may have therein a stirrer or an ultrasound generator to disperse the organic compound uniformly.

Of the liquid that has been ejected by any one of the above ejection methods, a portion that passes through an opening of the mask is adhered to the substrate 301 to form the layer 305a containing aggregations of the organic compound. The position where the film is to be formed may be controlled by charging or grounding the liquid using an electrode provided in the nozzle, the container or in the chamber or by other means. In FIG. 3A, ring-like charging means 306, a corona discharge electrode, for example, is placed at the tip of the nozzle. The charging means 306 is not always necessary.

The liquid is ejected as described above intermittently or continuously while moving the substrate in the X direction or Y direction to obtain a desired pattern. Alternatively, the substrate may be fixed while moving the nozzle in the X direction or Y direction to obtain a desired pattern.

A substrate heater may be provided to be brought into contact with the substrate and heat the substrate during formation of the film. In the present invention the temperature of the surface of the substrate is set to room temperature to 200° C.

This method is characterized in that an organic compound 305b adhered to the mask during formation of the organic compound layer 305a can be recovered and reused.

For simplification, a substrate holder for fixing the substrate and a holder for fixing the mask are not shown in FIGS. 3A to 3C. Each example shown here has only one nozzle 302 but a plurality of nozzles may be used.

The apparatus in the drawings is suitable for mass production. The mask here has an opening like a slit but the form of the mask is not limited thereto. The mask can be designed to suit individual cases.

Materials preferred in the present invention will be listed below. However, materials that can be used in an organic light emitting element of the present invention are not limited thereto.

Examples of preferred insoluble organic material that serves as the guest include a pigment represented by quinacridon (abbreviated as Qd) or copper phthalocyanine (abbreviated as CuPc), and a condensed polycyclic organic compound such as bathocuproine (abbreviated as BCP). An orthometal complex of iridium. typically, tris(2-phenylpyridine) iridium (abbreviated as Ir(ppy)3) is also difficult to dissolve in some solvents.

Also preferable as the insoluble organic material is a (conjugate polymer that has no substituent (a polymer having a ( conjugate material for its principal chain). Examples thereof include poly(1,4-phenylene vinylene) (abbreviated as PPV). poly(1,4-naphthalene vinylene) (abbreviated as PNV), poly (2-phenyl-1,4-phenylene vinylene) (abbreviated as Phenyl-PPV), polythiophene (abbreviated as PT), poly(3-phenylthiophene) (abbreviated as PPT), poly(1,4-phenylene) (abbreviated as PPP), poly(2,7-fluorene) (abbreviated as PF), etc.

Of the above compounds, quinacridon, tris(2-phenylpyridine) iridium, poly(1,4-phenylene vinylene), poly(1,4-naphthalene vinylene), poly(2-phenyl-1,4-phenylene vinylene), polythiophene, poly(3-phenylthiophene), poly(1,4-phenylene), poly(2,7-fluorene) are preferably used as light emitting materials that serve as the guest. Iridium complexes typical example of which is tris(2-phenylpyridine) iridium are triplet light emitting materials.

The soluble organic material that serves as the host is preferably a ( conjugate polymer having a substituent and a pendant polymer having a ( conjugate material for its side chain. Examples thereof include RO-PPV and poly(N-vinylcarbazole) (hereinafter referred to as PVK). In addition to the high molecular weight materials, low molecular weight materials soluble in various solvents can be used.

An inorganic compound may be introduced to the organic light emitting element of the present invention to improve its characteristics. Typically, LiF or $CaF_2$ is formed into a film as a cathode buffer layer to improve injection of electrons.

Embodiment 1

First, 200 mg of PVK and 110 mg, of 2-(4-biphenyl)-5-(4-tert-butylphenyl)-1,3,4-oxadiazole (hereinafter referred to as PBD) are dissolved in 20 ml of toluene.

Next, 6.55 mg of Ir(ppy)3 is dispersed in the solution of the mixture of PVK and PBD. PVK and PBD serve as host materials (soluble) and Ir(ppy)3 serves as a guest material (insoluble). In this dispersion solution, the materials satisfy a molar ratio of PVK:PBD:Ir (ppy)3=100:30:1.

Figure 4:
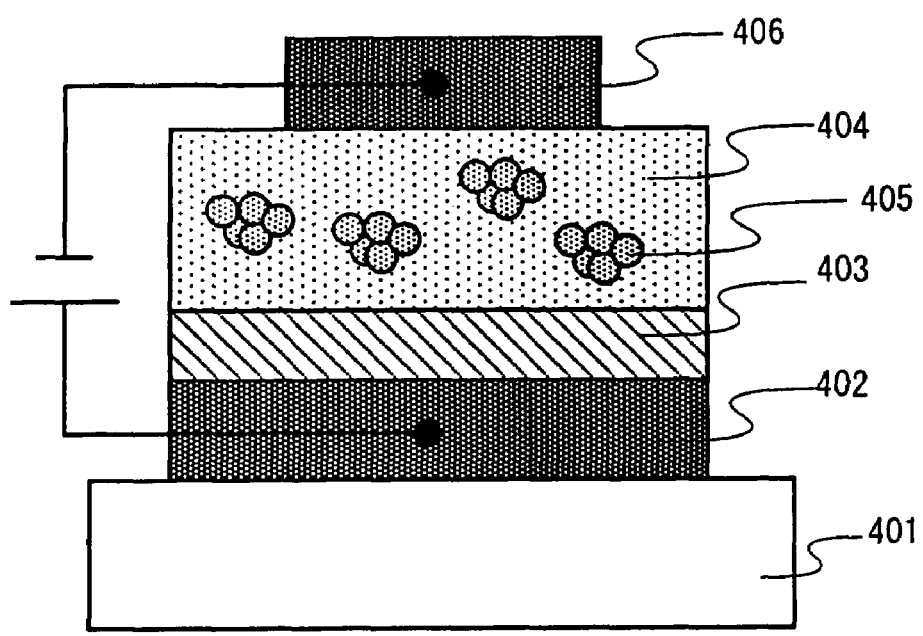
FIG. 4 is a diagram showing the structure of an organic light emitting element.

Using the dispersion solution prepared as above, an organic light emitting element is manufactured. The element structure thereof is shown in FIG. 4. First, an element formed ITO film is formed on a glass substrate 401 by sputtering to have a thickness of about 100 nm and an anode 402 is formed on the film.

An aqueous solution of poly(ethylene dioxythiophene) and poly(styrene sulfonic acid) (hereinafter referred to as PEDOT/PSS) is applied to the glass substrate 401 having the anode 402 by spin coating, thereby forming a film thereof. The PEDOT/PSS film serves as a hole injection layer 403.

After moisture is vaporized by heating treatment, the dispersion solution prepared as above is applied by spin coating to form an organic compound layer. In the organic compound layer. Ir(ppy)3 that is a triplet light emitting material (guest material) forms aggregations (clusters) 405 in a host 404 consisting of PVK and PBD. Then, an Al:Li alloy is deposited by vacuum evaporation to form a cathode 406 and complete the organic light emitting element.

Embodiment 2

This embodiment describes a light emitting device that includes an organic light emitting element according to the present invention. FIGS. 5A and 5B are sectional views of an active matrix light emitting device that uses an organic light emitting element of the present invention.

A thin film transistor (hereinafter referred to as TFT) is used here as an active element, but the active element may be a MOS transistor. The TFT shown as an example is a top gate TFT (planar TFT, to be specific), but a bottom gate TFT (typically a reverse stagger TFT) may be used instead.

In FIG. 5A, 501 denotes a substrate. The substrate used here can transmit visible light so that light is sent to the outside from the substrate side. Specifically, a glass substrate, a quartz substrate, a crystal glass substrate, or a plastic substrate (including a plastic film) can be used. The substrate 501 refers to the substrate plus an insulating film formed on the surface of the substrate.

On the substrate 501, a pixel portion 511 and a driving circuit 512 are provided. The pixel portion 511 will be described first.

The pixel portion 511 is a region for displaying an image. A plurality of pixels are placed on the substrate, and each pixel is provided with a TFT 502 for controlling a current flowing in the organic light emitting element (hereinafter referred to as current controlling TFT). a pixel electrode (anode) 503, an organic compound film 504, and a cathode 505. Although only the current controlling TFT is shown in FIG. 5A, each pixel has a TFT for controlling a voltage applied to a gate of the current controlling TFT (hereinafter referred to as switching TFT).

The current controlling TFT 502 here is preferably a p-channel TFT. Though an n-channel TFT may be used instead, a p-channel TFT as the current controlling TFT is more successful in reducing current consumption if the current controlling TFT is connected to the anode of the organic light emitting element as shown in FIGS. 5A and 5B. Note that, the switching TFT may be formed by either an n-channel TFT or a p-channel TFT.

A drain of the current controlling TFT 502 is electrically connected to the pixel electrode 503. In this embodiment, a conductive material having a work function of 4.5 to 5.5 eV is used as the material of the pixel electrode 503, and therefore the pixel electrode 503 functions as the anode of the organic light emitting element. A light-transmissive material, typically, indium oxide, tin oxide, zinc oxide, or a compound of these (ITO, for example), is used for the pixel electrode 503. On the pixel electrode 503, the organic compound film 504 is formed.

On the organic compound film 504, the cathode 505 is provided. The material of the cathode 505 is desirably a conductive material having a work function of 2.5 to 3.5 eV. Typically, the cathode 505 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 503, the organic compound film 504, and the cathode 505 is covered with a protective film 506. The protective film 506 is provided to protect the organic light emitting element from oxygen and moisture. Materials usable for the protective film 506 include silicon nitride, silicon oxynitride. aluminum oxide, tantalum oxide, and carbon (specifically, diamond-like carbon).

Next, the driving circuit 512 will be described. The driving circuit 512 is a region for controlling timing of signals (gate signals and data signals) to be sent to the pixel portion 511, and is provided with a shift register, a buffer, and a latch, as well as an analog switch (transfer gate) or level shifter. In FIG. 5A, the basic unit of these circuits is a CMOS circuit composed of an n-channel TFT 507 and a p-channel TFT 508.

Known circuits structures can be applied to the shift register, the buffer, the latch, and the analog switch (transfer gate) or level shifter. Although the pixel portion 511 and the driving circuit 512 are provided on the same substrate in FIGS. 5A and 5B. IC or LSI may be electrically connected to the substrate instead of placing the driving circuit 512 on the substrate.

The pixel electrode (anode) 503 is electrically connected to the current controlling TFT 502 in FIGS. 5A and 5B but the cathode may be connected to the current controlling TFT instead. In this case, the pixel electrode is formed from the material of the cathode 505 whereas the cathode is formed from the material of the pixel electrode (anode) 503. The current controlling TFT in this case is preferably an n-channel TFT.

The light emitting device shown in FIG. 5A is manufactured by a process in which formation of the pixel electrode 503 precedes formation of a wiring line 509. However, this process could roughen the surface of the pixel electrode 503. The roughened surface of the pixel electrode 503 may degrade characteristic of the organic light emitting element since it is a current-driven type-element.

Then the pixel electrode 503 is formed after forming the wiring line 509 to obtain a light emitting device shown in FIG. 5B. In this case, inflection of current from the pixel electrode 503 can be improved compared to the structure of FIG. 5A.

In FIGS. 5A and 5B, a forward-tapered bank structure 510 separates the pixels placed in the pixel portion 511 from one another. If this bank structure is reverse-tapered, a contact between the bank structure and the pixel electrode can be avoided.

FIGS. 6A and 6B show the exterior of the active matrix light emitting device illustrated in FIG. 5B. FIG. 6A is a top view thereof and FIG. 6B is a sectional view taken along the line P-P' of FIG. 6A. The symbols in FIGS. 5A and 5B are used in FIGS. 6A and 6B.

In FIG. 6A, 601 denotes a pixel portion, 602 denotes a gate signal side driving circuit, and 603 denotes a data signal side driving circuit. Signals to be sent to the gate signal side driving circuit 602 and the data signal side driving, circuit 603 are inputted from a TAB (tape automated bonding) tape 605 through an input wiring line 604. Though not shown in the drawing, the TAB tape 605 may be replaced by a TCP (tape carrier package) that is obtained by providing a TAB tape with an IC (integrated circuit).

Denoted by 606 is the cover member that is provided in an upper part of the light emitting device shown in FIG. 5B, and is bonded with a seal member 607 formed of a resin. The cover member 606 may be any material as long as it does not transmit oxygen and water. In this embodiment, as shown in FIG. 6B, the cover member 606 is composed of a plastic member 606a and carbon films (specifically, diamond-like carbon films) 606b and 606c that are formed on the front and back of the plastic member 606a, respectively.

As shown in FIG. 6B, the seal member 607 is covered with a sealing member 608 made of a resin so that the organic light emitting element is completely sealed in an airtight space 609. The airtight space 609 is filled with inert gas (typically, nitrogen gas or noble gas). a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 3

Figure 7:
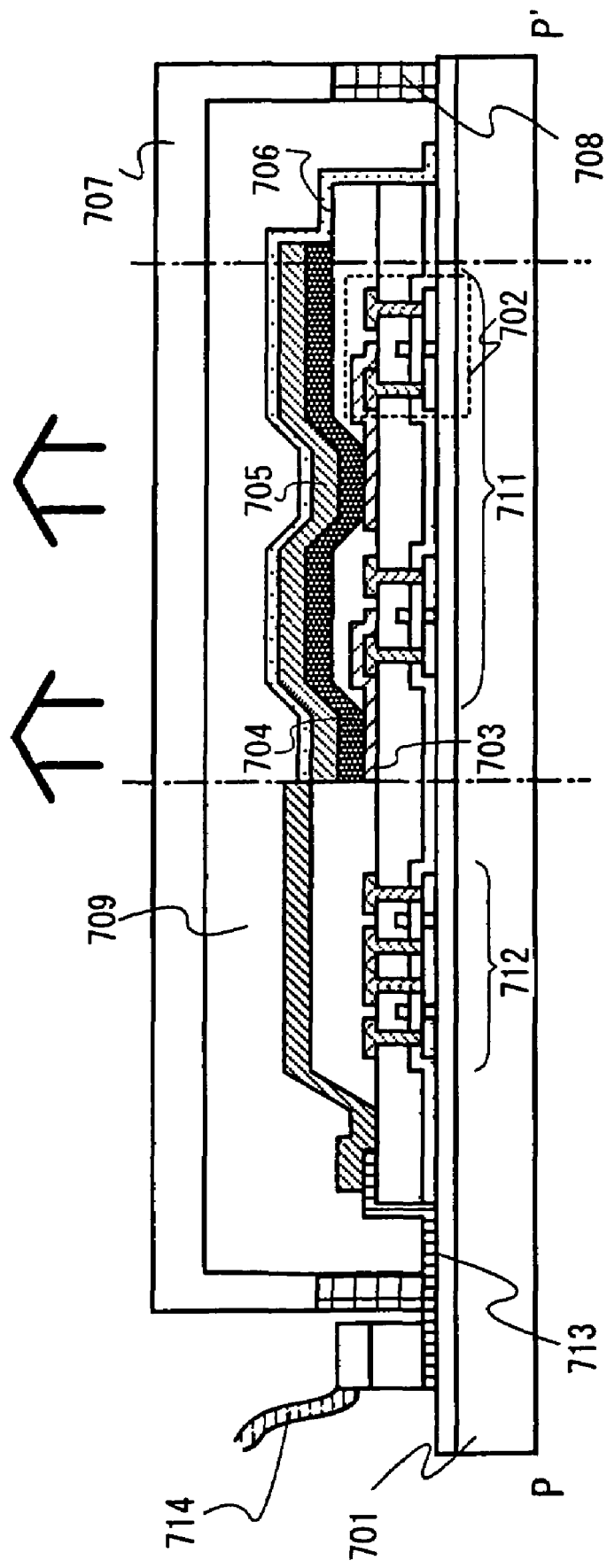
FIG. 7 is a diagram showing the sectional structure of a light emitting device.

This embodiment shows an active matrix light emitting device as an example of a light emitting device that includes an organic light emitting element according to the present invention. Unlike Embodiment 2, in the light emitting device of this embodiment, light is taken out from the opposite side of a substrate on which an active element is formed (hereinafter referred to as upward emission). FIG. 7 is a sectional view thereof.

A thin film transistor (hereinafter referred to as TFT) is used here as the active element, but the active element may be a MOS transistor. The TFT shown as an example is a top gate TFT (planar TFT, to be specific). but a bottom gate TFT (typically a reverse stagger TFT) may be used instead.

A substrate 701, a current controlling TFT 702 that is formed in a pixel portion 711, and a driving circuit 712 of this embodiment have the same structure as those of Embodiment 2.

A first electrode 703, which is connected to a drain of the current controlling TFT 702, is used as an anode in this embodiment, and therefore is formed preferably from a conductive material having a large work function. Typical examples of the conductive material include metals such as nickel, palladium, tungsten, gold, and silver. In this embodiment, the first electrode 703 desirably does not transmit light. More desirably, the electrode is formed from a material that is highly reflective of light.

On the first electrode 703, an organic compound film 704 is formed. Provided on the organic compound film 704 is a second electrode 705 which serves as a cathode in this embodiment. Accordingly, the material of the second electrode 705 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 705, because the upward emission is taken in this embodiment. Therefore, when used for the second electrode, the metal is preferably formed into a very thin film about 20 nm in thickness.

A layer composed of the first electrode 703, the organic compound film 704 and the second electrode 705 is covered with a protective film 706. The protective film 706 is provided to protect the organic light emitting element from oxygen and moisture. In this embodiment, any material can be used for the protective film as long as it transmits light.

The first electrode (anode) 703 is electrically connected to the current controlling TFT 702 in FIG. 7 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 707 is a cover member and is bonded with a seal member 708 formed of a resin. The cover member 707 may be any material as long as it transmits light but not oxygen and water. In this embodiment, glass is used. An airtight space 709 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 714 through an input wiring line 713. Though not shown in the drawing, the TAB tape 714 may be replaced by a TCP (tape carrier package) that is obtained by providing a TAB tape with an IC (integrated circuit).

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting, element included in the light emitting device of this embodiment.

Embodiment 4

Figure 8A:
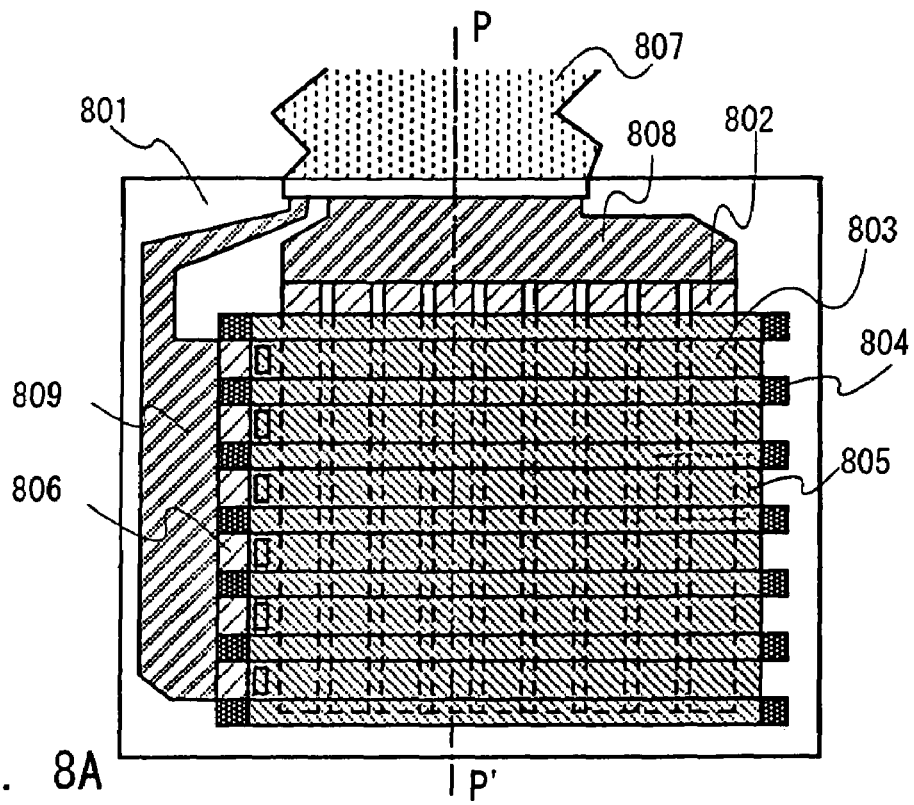
FIGS. 8A to 8C are diagrams of a light emitting device with FIG. 8A showing the top structure thereof and FIGS. 8B and 8C showing the sectional structure thereof.
Figure 8B:
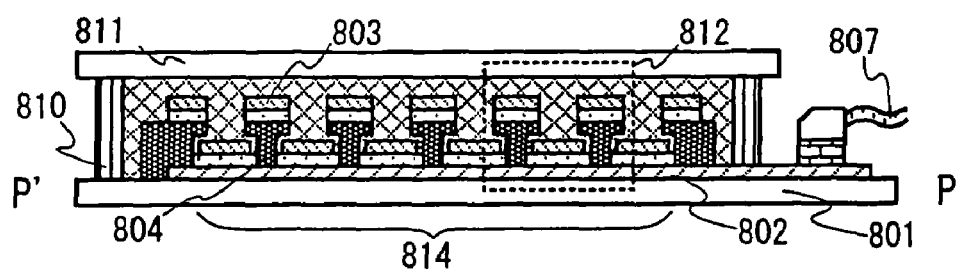

This embodiment shows a passive matrix light emitting device as an example of a light emitting device that includes an organic light emitting element disclosed in the present invention. FIG. 8A is a top view thereof and FIG. 8B is a sectional view taken along the line P-P' of FIG. 8A.

In FIG. 8A, denoted by 801 is a substrate, which is formed of a plastic material here. The plastic material, which can be used is a plate or film of polyimide, polyamide, an acrylic resin, an epoxy resin, PES (polyethylene sulfile). PC (polycarbonate), PET (polyethylene terephthalate), or PEN (polyethylene naphthalate).

802 denotes scanning lines (anodes) formed from a conductive oxide film. In this embodiment, the conductive oxide film is obtained by doping zinc oxide with gallium oxide, 803 denotes data lines (cathodes) formed from a metal film, a bismuth film, in this embodiment, 804 denotes banks formed of an acrylic resin. The banks function as partition walls that separate the data lines 803 from one another. The scanning lines 802 and the data lines 803 respectively form stripe patterns and the patterns cross each other at right angles. Though not shown in FIG. 8A, an organic compound film is sandwiched between the scanning lines 802 and the data lines 803 and intersection portions 805 serve as pixels.

The scanning lines 802 and the data lines 803 are connected to an external driving circuit through a TAB tape 807. 808 denotes a group of wiring lines comprised of a mass of the scanning lines 802. 809 denotes a group of wiring lines comprised of a mass of connection wiring lines 806 that are connected to the data lines 803. Though not shown, the TAB tape 807 may be replaced by TCP that is obtained by providing a TAB tape with an IC.

In FIG. 8B, 810 denotes a seal member and 811 denotes a cover member that is bonded to a plastic member 801 with the seal member 810. A photo-curable resin can be used for the seal member 810. A preferable material of the seal member is one which allows little gas leakage and which absorbs little moisture. The cover member is preferably made from the same material as the substrate 801, and glass (including quartz glass) or plastic can be used. Here, a plastic material is used for the cover member.

Figure 8C:
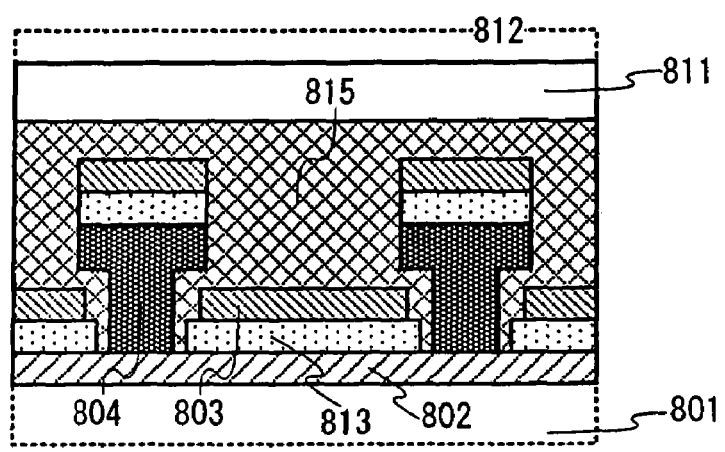

FIG. 8C is an enlarged view of the structure of a pixel region 812. 813 denotes an organic compound film. Lower layers of the banks 804 are narrower than upper layers and therefore the banks can physically separate the data lines 803 from one another. A pixel portion 814 surrounded by the seal member 810 is shut off of the outside air by a sealing member 815 formed of a resin. Degradation of the organic compound film is thus prevented.

In the light emitting device structured as above in accordance with the present invention, the pixel portion 814 is composed of the scanning lines 802, the data lines 803, the banks 804, and the organic compound film 813. Therefore, the light emitting device can be manufactured by a very simple process.

A polarizing plate may be provided on a display face (the face on which an image is displayed to be observed by a viewer) of the light emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting elements according to the present invention can be used as the organic light emitting element included in the light emitting device of this embodiment.

Embodiment 5

This embodiment shows an example of attaching a printed wiring board to the light emitting device shown in Embodiment 4 to make the device into a module.

Figure 9A:
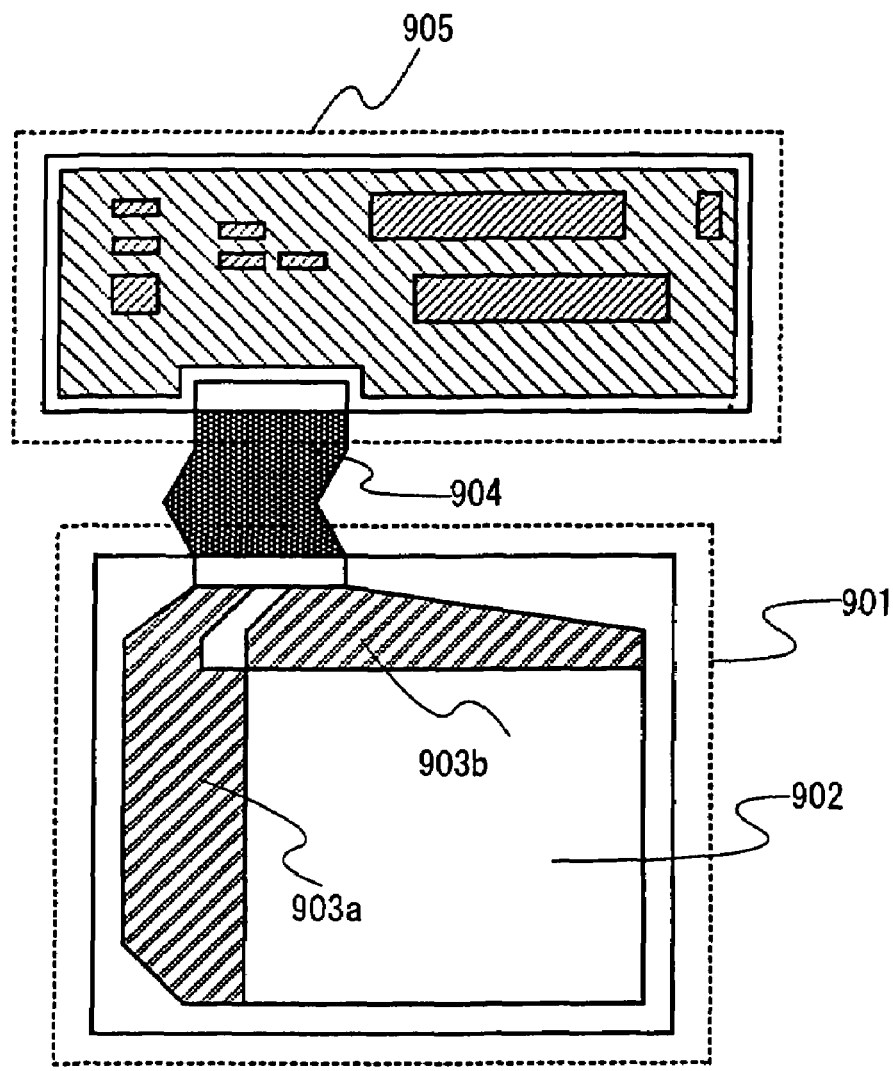
FIGS. 9A and 9B are diagrams showing the structure of a light emitting device.

In a module shown in FIG. 9A, a TAB tape 904 is attached to a substrate 901 (here including a pixel portion 902 and wiring lines 903a and 903b), and a printed wiring board 905 is attached to the substrate through the TAB tape 904.

Figure 9B:
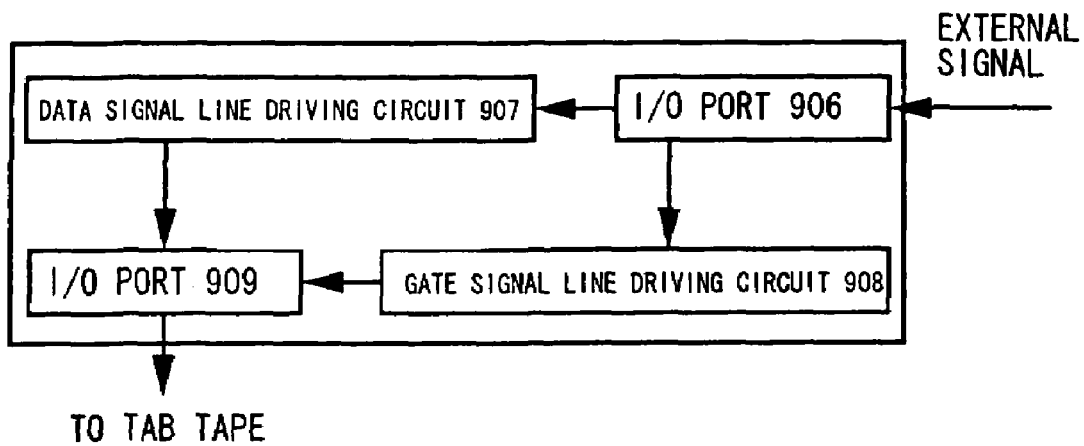

A functional block diagram of the printed wiring board 905 is shown in FIG. 9B. An IC functioning as at least I/O ports (input or output portions) 906 and 909, a data signal side driving circuit 907, and a gate signal side driving circuit 908 are provided within the printed wiring board 905.

In this specification, a module structured by attaching a TAB tape to a substrate with a pixel portion formed on its surface and by attaching a printed wiring board that functions as a driving circuit to the substrate through the TAB tape as above is specially named a module with external driving circuit.

Any of organic light emitting elements disclosed in the present invention can be used as the organic light emitting element included in the light emitting device of this embodiment.

Embodiment 6

This embodiment shows an example of attaching a printed wiring board to the light emitting device shown in Embodiment 2, 3, or 4 to make the device into a module.

Figure 10A:
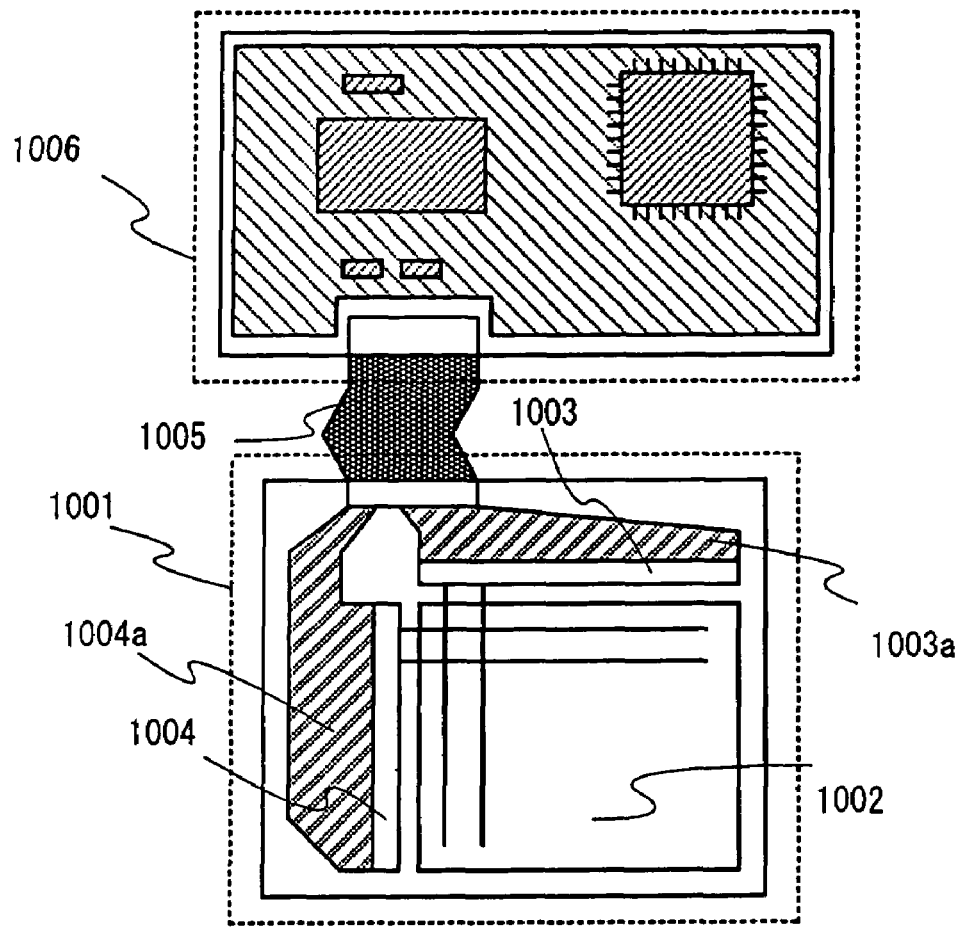
FIGS. 10A and 10B are diagrams showing the structure of a light emitting device.

In a module shown in FIG. 10A, a TAB tape 1005 is attached to a substrate 1001 (here including a pixel portion 1002, a data signal side driving circuit 1003, a gate signal side driving circuit 1004, and wiring lines 1003a and 1004a), and a printed wiring board 1006 is attached to the substrate through the TAB tape 1005. A functional block diagram of the printed wiring board 1006 is shown in FIG. 10B.

Figure 10B:
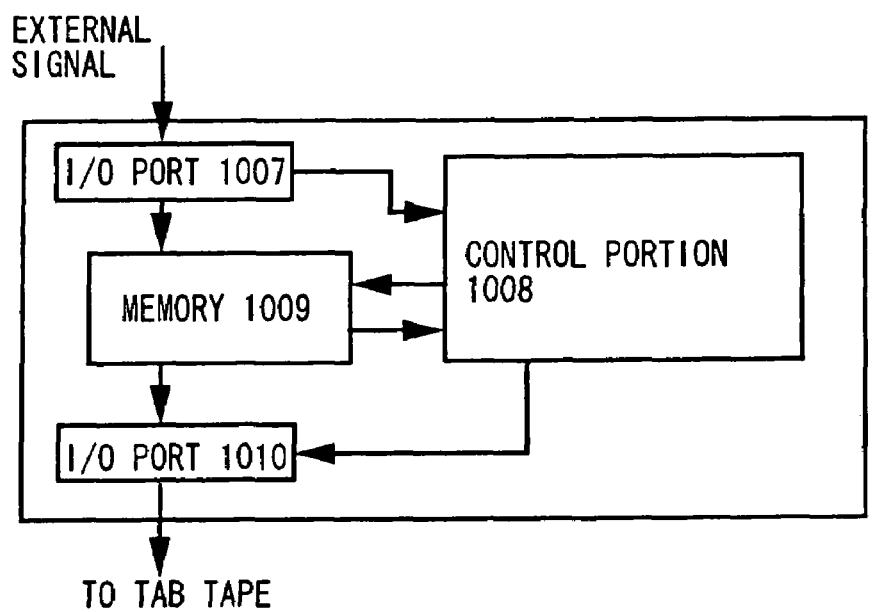

As shown in FIG. 10B, an IC functioning as at least I/O ports 1007 and 1010 and a control unit 1008 is provided within the printed wiring board 1006. A memory unit 1009 is provided here but it is not always necessary. The control unit 1008 is a portion having functions for controlling the driving circuits and correction of image data.

In this specification, a module structured by attaching a printed wiring board that has functions as a controller to a substrate on which an organic light emitting element is formed as above is specially named a module with external controller.

Any of organic light emitting elements disclosed in the present invention can be used as the organic light emitting element included in the light emitting device of this embodiment.

Embodiment 7

This embodiment shows an example of light emitting device in which an organic light emitting element is driven in accordance with digital time gray scale display. The light emitting device of the present invention can provide uniform images in digital time gray scale display and therefore is very useful.

Figure 11A:
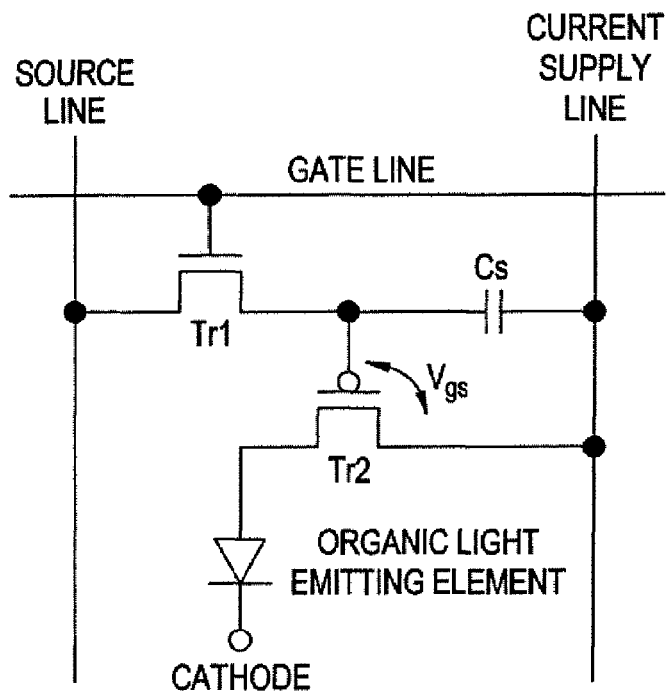
FIGS. 11A to 11C are diagrams showing the structure of a light emitting device.

FIG. 11A shows the circuit structure of a pixel that uses an organic light emitting element. Tr represents a transistor and Cs represents a storage capacitor. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic light emitting element.

After Tr1 is selected, Tr1 is turned OFF to hold the voltage ($V_{gs}$) of Cs. Accordingly, a current continues to flow in an amount dependent of $V_{gs}$.

Figure 11B:
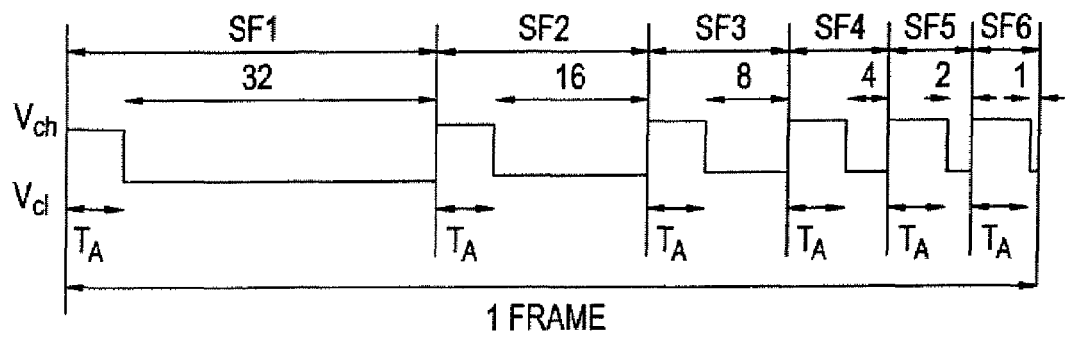

FIG. 11B shows a chart for driving this circuit in accordance with digital time gray scale display. In digital time gray scale display, one frame is divided into plural sub-frames. FIG. 11B shows 6 bit gray scale in which one frame is divided into six sub-frames. In this case, the ratio of light emission periods of the sub-frames is 32: 16:8:4:2:1.

Figure 11C:
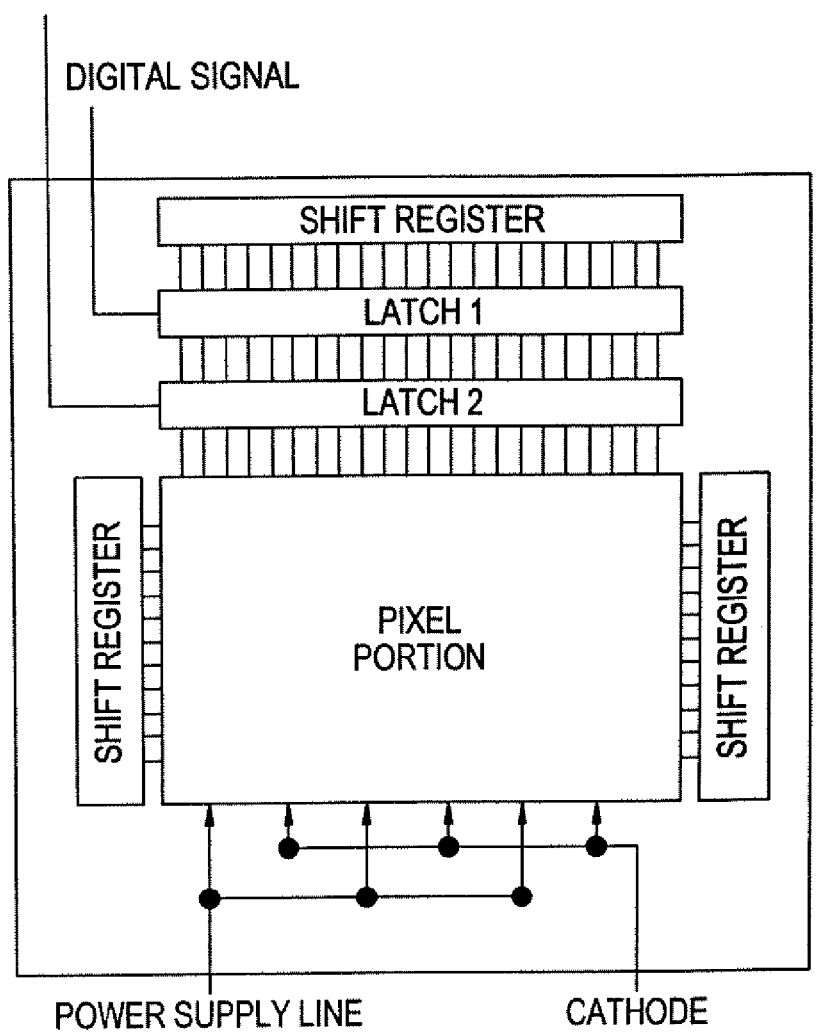

FIG. 11C schematically shows driving circuits of TFT substrate in this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

Embodiment 8

This embodiment describes a method of manufacturing a pixel portion of a light emitting device with reference to FIGS. 15A to 15E and FIGS. 16A to 16C. In the description given in this embodiment, a thin film transistor (TFT) is formed as a semiconductor element.

Figure 15A:
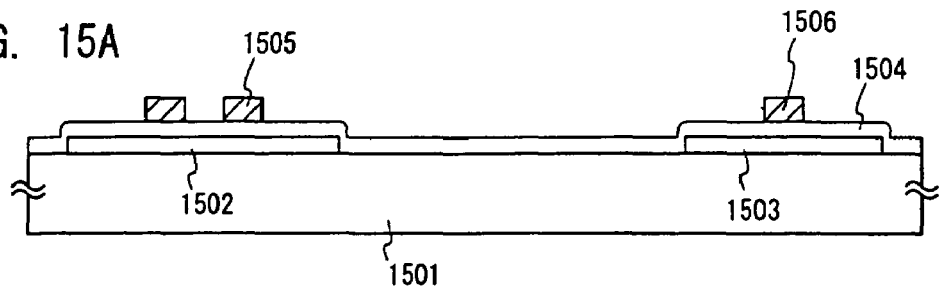
FIGS. 15A to 15E are diagrams showing a process of manufacturing a light emitting device.

First, a crystalline silicon film is formed to have a thickness of 50 nm on a substrate 1501 transmissive of light. Any known method can be used to form the crystalline silicon film. The crystalline silicon film is then patterned to form island-like semiconductor layers 1502 and 1503 (hereinafter referred to as active layers). A silicon oxide film is formed next to serve as a gate insulating film 1504 and cover the active layers 1502 and 1503. Gate electrodes 1505 and 1506 are formed on the gate insulating film 1504 (FIG. 15A). An element selected from the group consisting of Ta, W, Ti, Mo, Al, and Cu, or an alloy material or compound material mainly containing the above elements can be used to form the gate electrodes 1505 and 1506. Here, a tungsten film or tungsten alloy film with a thickness of 350 nm is used for the gate electrodes 1505 and 1506. The gate electrodes may have a laminate structure with two or more layers. For example, the gate electrodes may have a three-layered structure in which a tungsten film with a thickness of 50 nm, an aluminum-silicon (Al—Si) alloy film with a thickness of 500 nm, and a titanium film with a thickness of 30 nm are layered in order.

Figure 15B:
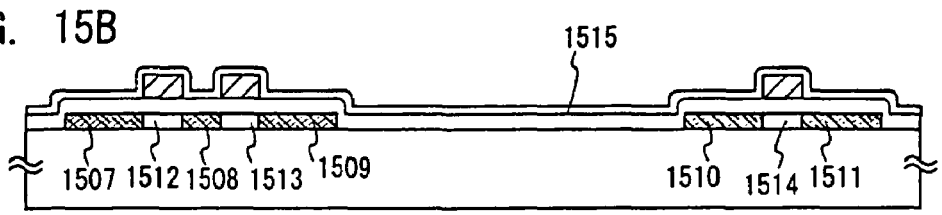

Next, as shown in FIG. 15B, the gate electrodes 1505 and 1506 are used as masks to dope the semiconductor layers with an element belonging to Group 13 in the periodic table (typically boron). Any known doping method can be employed. Impurity regions 1507 to 1510 having the p type conductivity (hereinafter referred to as p type impurity regions) are thus formed. Channel formation regions 1512 to 1514 are defined under the gate electrodes 1505 and 1506. Note that the p type impurity regions 1507 to 1511 respectively serve as a source region or a drain region.

Formed next is a protective film (here, silicon nitride film) 1515 with a thickness of 50 nm. Thereafter, the element belonging to Group 13 in the periodic table, which has been used for doping, is activated by heat treatment. The activation is achieved by furnace annealing, laser annealing, or lamp annealing, or by a combination of the above annealing. In this embodiment, heat treatment is conducted in a nitrogen atmosphere at 500° C. for four hours.

It is effective to conduct hydrogenation treatment after the activation is finished. A known hydrogen annealing technique or plasma hydrogenation technique can be employed for the hydrogenation treatment.

Figure 15C:
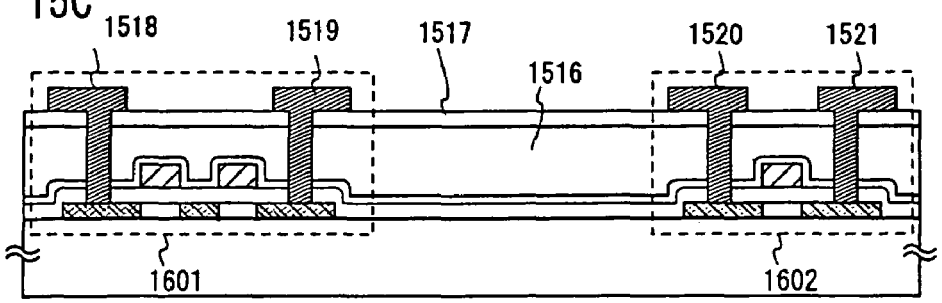
Figure 15D:
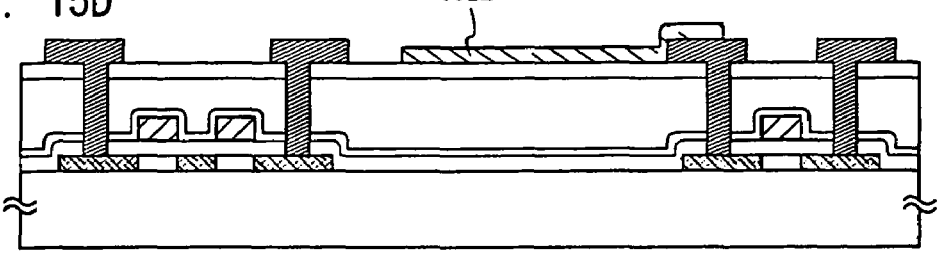
Figure 15E:
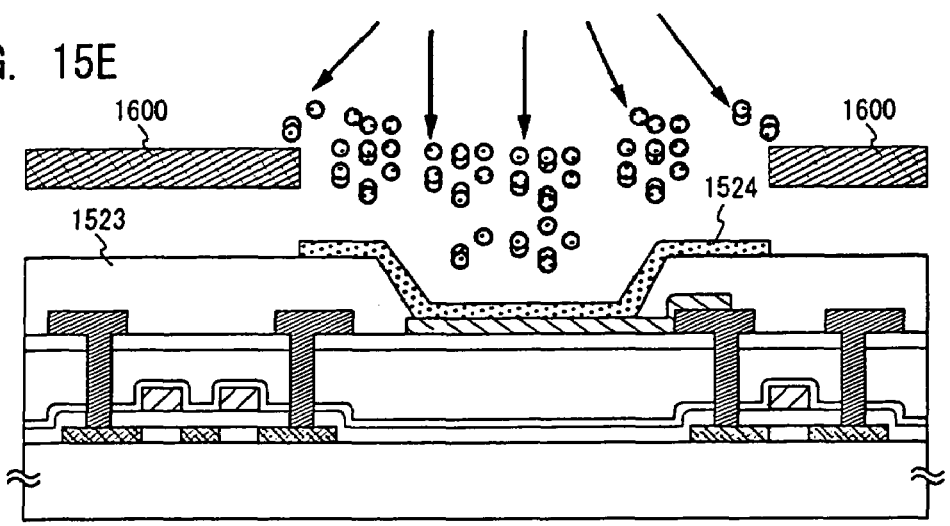

Next, as shown in FIG. 15C, a first interlayer insulating film 1516 is formed from an organic resin such as polyimide, acrylic, or polyimideamide to have a thickness of 800 nm. The organic resin is applied by spinner and then heated to be burnt or polymerized, thereby obtaining a flat surface. Organic resin materials in general are low in dielectric constant and therefore can reduce parasitic capacitance. Note that, the first interlayer insulating film 1516 may instead be an inorganic insulating film.

Next, a second interlayer insulating film 1517 is formed on the first interlayer insulating film 1516 so that gas leakage from the first interlayer insulating film 1516 does not affect the light emitting element. The second interlayer insulating film 1517 is an inorganic insulating film, typically, a silicon oxide film, a silicon oxynitride film, or a silicon nitride film, or a laminate having the above insulating films in combination. The second interlayer insulating film is formed by plasma CVD in which the reaction pressure is set to 20 to 200 Pa, the substrate temperature to 300 to 400° C., and the power density to 0.1 to 1.0 W/cm$^2$ at high frequency (13.56 MHz) for electric discharge. Alternatively, the surface of the interlayer insulating film is subjected to plasma treatment to form a cured film that contains one or more kinds of gas elements selected from the group consisting of hydrogen, nitrogen, carbon halide, hydrogen fluoride, and noble gas.

Thereafter, a resist mask having a desired pattern is formed and contact holes reaching drain regions of TFTs are formed to form wiring lines 1518 to 1521. The wiring lines are obtained by patterning into a desired pattern a conductive metal film that is formed from Al or Ti or an alloy of Al and Ti by sputtering or vacuum evaporation.

The TFTs are thus completed. In the pixel portion of the light emitting device of this embodiment, a switching TFT 1601 and a current controlling TFT 1602 are formed as shown in FIG. 15C and an erasing TFT (not shown) is formed at the same time. A gate electrode of the erasing TFT is a part of a gate wiring line 1502. The gate wiring line 1502 and a gate wiring line 1501 that forms a gate electrode of the switching TFT 1601 are separate wiring lines. In this embodiment, these TFTs are all p-channel TFTs.

A storage capacitor is formed at the same time the TFTs are formed. The storage capacitor is composed of a lower storage capacitor and an upper storage capacitor. The lower storage capacitor is composed of a semiconductor layer that is formed at the same time the active layers of the TFTs are formed, the gate insulating film, and a wiring line that forms a gate electrode. The upper storage capacitor is composed of a wiring line that forms a gate electrode, the protective film, the first interlayer insulating film, the second interlayer insulating film, and a current supply line. The semiconductor layer is electrically connected to the current supply line.

Next, a conductive film transmissive of light, here, an ITO film, is formed to serve as an anode of the light emitting element. The material of the conductive film is larger in work function than the material of the cathode. A material that is lower in sheet resistance than ITO film, specifically, platinum (Pt), chromium (Cr), tungsten (W), or nickel (Ni) may also be used. The thickness of the conductive film at this point is desirably 0.1 to 1 μm. The conductive film is then etched to form an anode 1522 as shown in FIG. 3D.

Thereafter, an organic resin film is formed on the entire surface from polyimide, acrylic, or polyimideamide. A thermally-curable material that is cured by heating or a photosensitive material that is cured by irradiation with ultraviolet ray is employed for the organic resin film. When a thermally-curable material is used, a resist mask is formed after the organic resin film is formed, and an insulating layer 1523 having an opening above the anode 1522 is formed by dry etching. When a photosensitive material is employed, a photo mask is used for exposure and development to form an insulating layer 1523 that has an opening above the anode 1522. In either case, the insulating layer 1523 is formed to have a tapered edge and cover an end of the anode 1522. Having the edge tapered, the insulating layer can be covered well by an organic compound layer that is formed later.

The organic compound layer is formed on the anode 1522. The organic compound layer in this embodiment is formed from an organic compound capable of injecting holes, and organic compounds that serve as host materials and luminous guest materials as shown in FIG. 17. In FIG. 17, components corresponding to those in FIGS. 15A to 15E and FIGS. 16A to 16C are denoted by the same reference symbols.

First, an aqueous solution of poly(ethylene dioxythiophene) and poly(styrene sulfonic acid) (hereinafter referred to as PEDOT/PSS) is formed into a film by spin coating. The PEDOT/PSS film acts as a hole injection layer 1524a.

Next, 200 mg of PVK and 110 mg of 2-(4-biphenyl)-5-(4-tert-butylphenyl)-1,3,4-oxadiazole (hereinafter referred to as PBD) are dissolved in 20 mg of toluene. 6.55 mg of an iridium complex that is a luminous organic compound, specifically, tris(2-phenylpyridine) iridium (hereinafter referred to as Ir(ppy)3) is dispersed in the solution of the mixture of PVK and PBD. That is, PVK and PBD serve as host materials (soluble) and Ir(ppy)3 serves as a guest material (insoluble). In this dispersion solution, the materials satisfy a molar ratio of PVK:PBD:Ir(ppy)3=100:30:1.

Figure 1A:
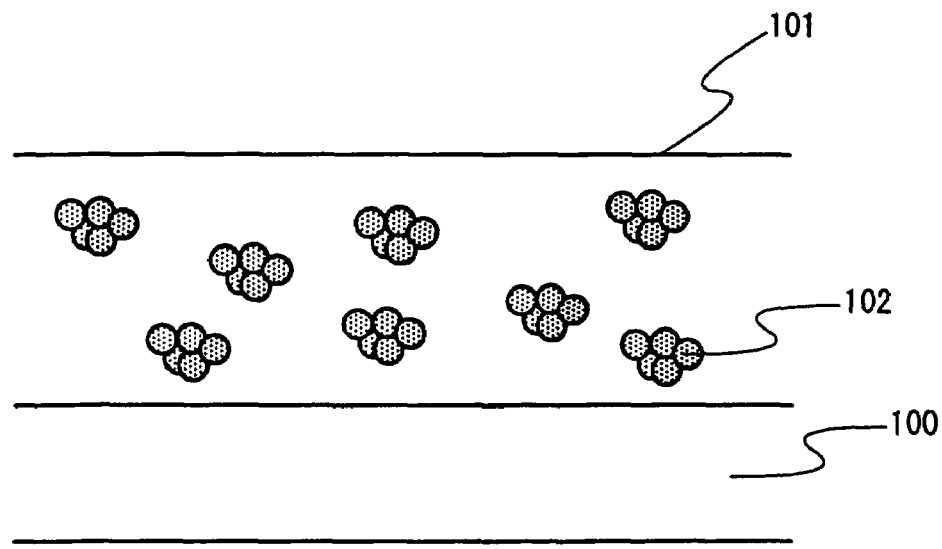
FIGS. 1A and 1B are diagrams showing film formation by dispersive articles.
Figure 1B:
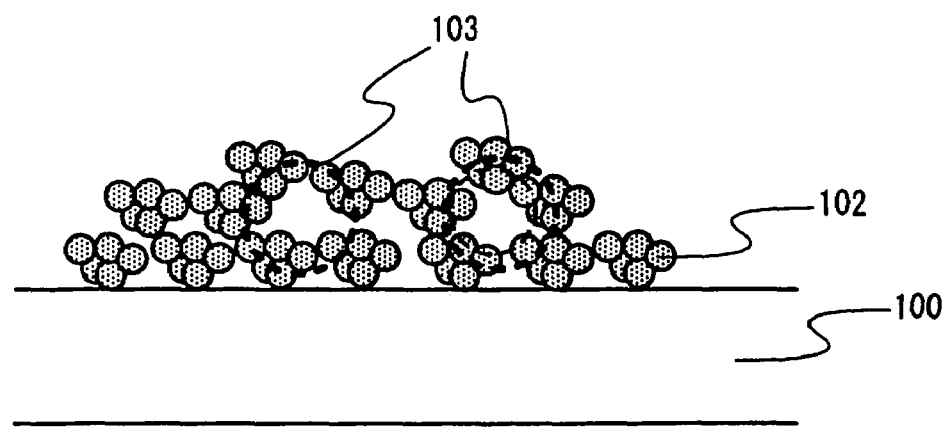

The dispersion solution is ejected from a nozzle (not shown) with nitrogen gas as shown in FIG. 1 SE. A light emitting layer 1524b is thus formed. The light emitting layer here is selectively formed using a mask 1600.

Figure 16A:
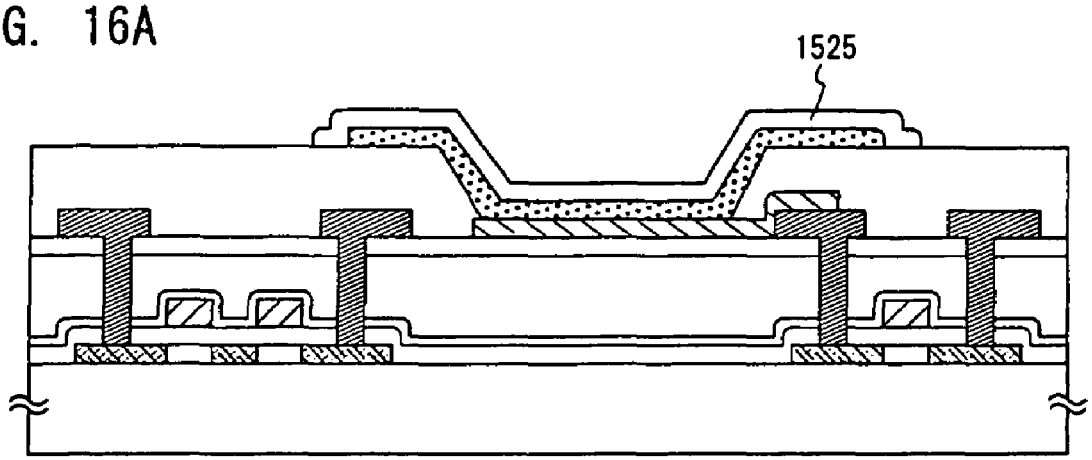
FIGS. 16A to 16C are diagrams showing a process of manufacturing a light emitting device.
Figure 16B:
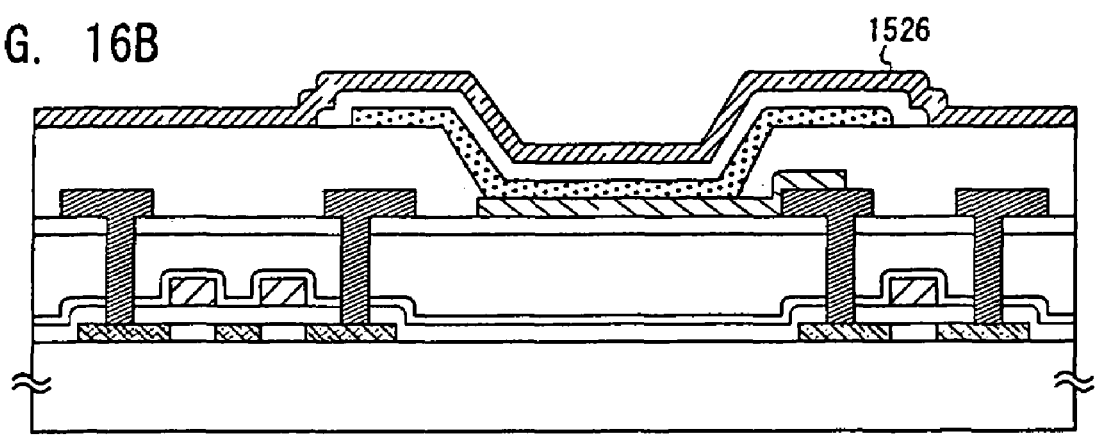
Figure 16C:
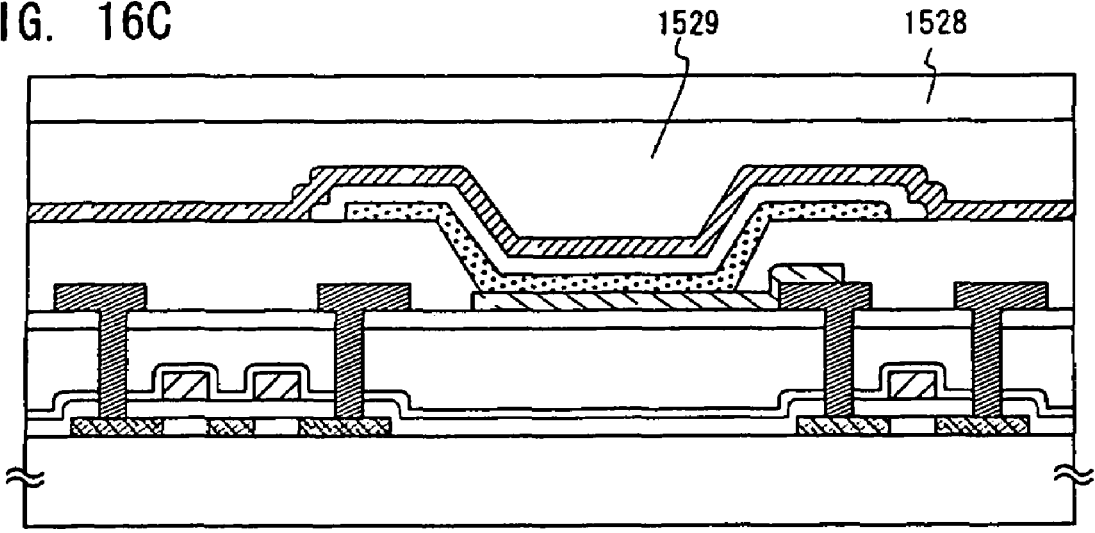
Figure 17:
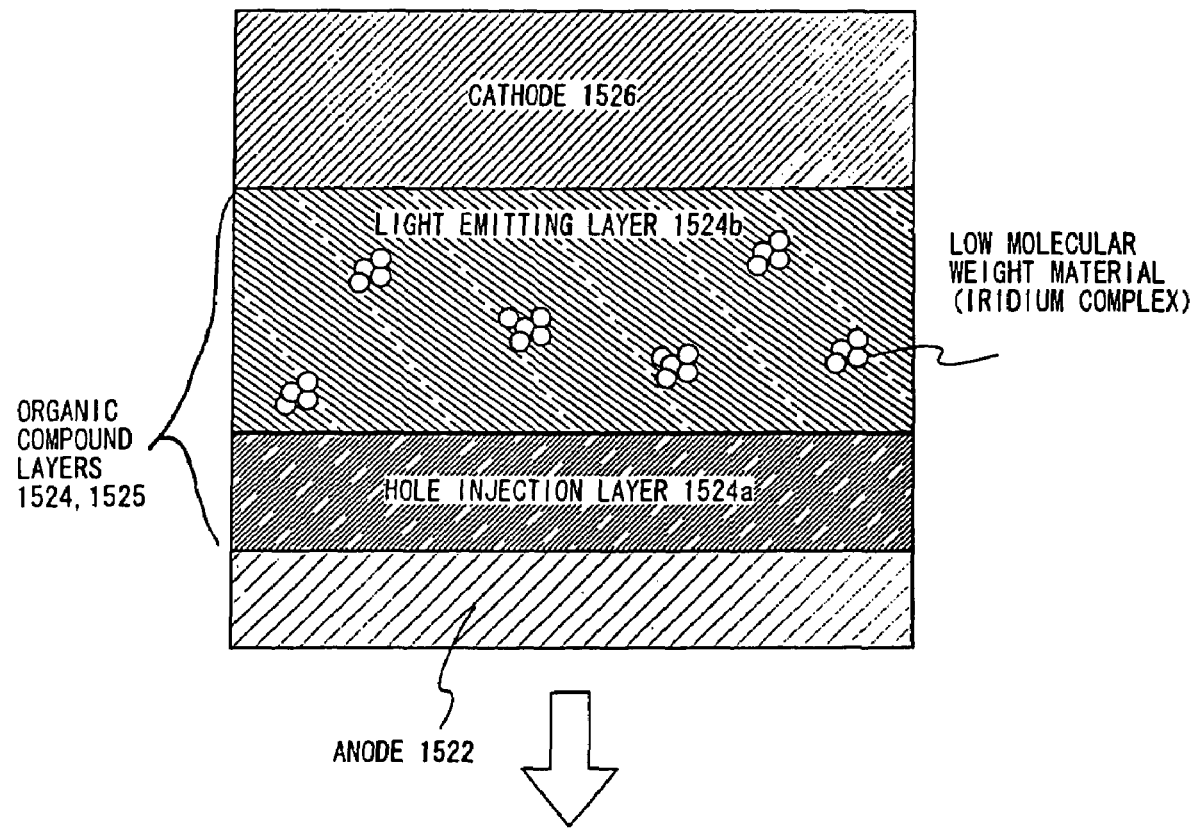
FIG. 17 is a diagram showing the structure of an organic compound layer.

Next, a cathode 1526 is formed by evaporation (FIG. 16B). The material of the cathode 1526 can be a Mg—Ag alloy or an Al—Li alloy. Alternatively, a film obtained by co-evaporation of aluminum and an element that belongs to Group 1 or 2 in the periodic table may be used for the cathode. The thickness of the cathode 1526 is preferably 80 to 200 nm.

The above steps complete the light emitting element composed of the anode 1522, the organic compound layer (the hole injection layer 1524a and the light emitting layer 1524b), and the cathode 1526 as shown in FIG. 17.

Although Ir(ppy)3 is used as the organic compound of the luminous guest material in the description here, the present invention is not limited thereto and a known luminous organic compound can be employed.

The light emitting layer of the organic compound layer is formed by an ejection method in this embodiment. However, the present invention is not limited thereto and the light emitting layer may be formed by application or extrusion instead.

In the example shown in this embodiment, the EL element has the hole injection layer and the light emitting layer but the present invention is not limited thereto. The EL element of the present invention can have, in addition to the hole injection layer and the light emitting layer, at least one layer selected from a hole transporting layer, a carrier blocking layer, an electron transporting layer, and an electron injection layer.

Embodiment 9

Figure 18A:
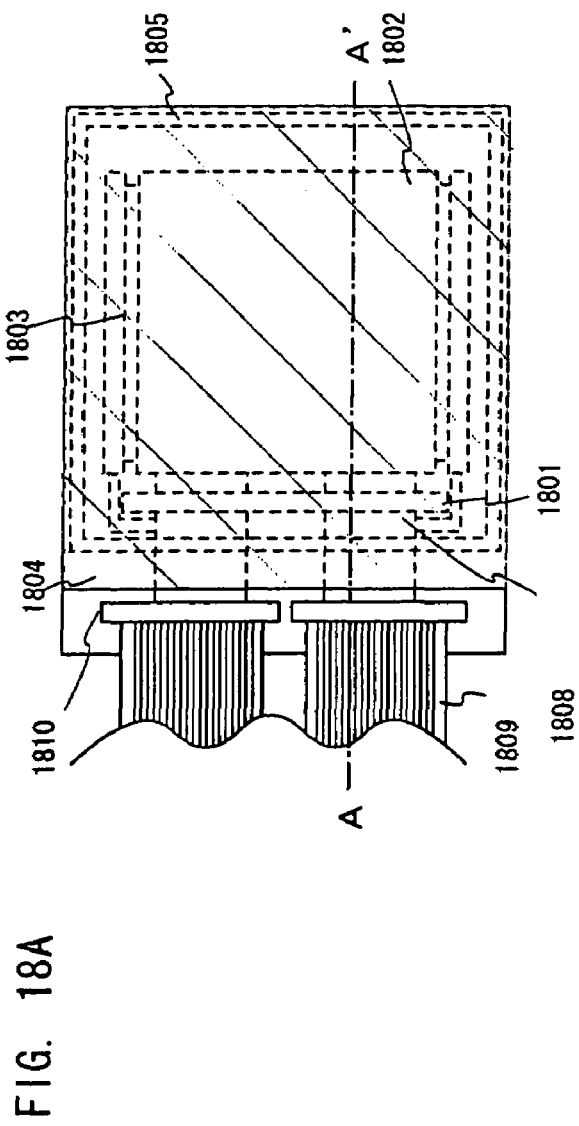
FIGS. 18A and 18B are diagrams showing the exterior of an EL module.
Figure 18B:
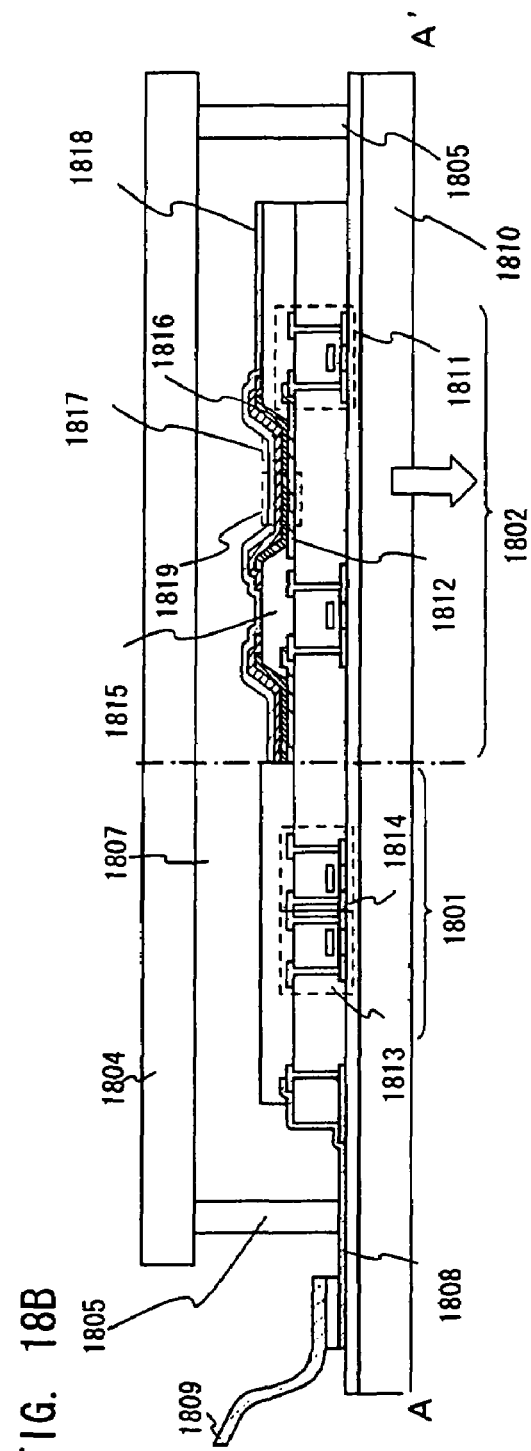

This embodiment describes the exterior of a light emitting device of the present invention with reference to FIGS. 18A and 18B.

FIG. 18A is a top view of a light emitting device and FIG. 18B is a sectional view taken along the line A-A' of FIG. 18A. A source signal line driving circuit, a pixel portion, and a gate signal line driving circuit are surrounded by dotted lines and denoted by 1801, 1802, and 1803, respectively. Denoted by 1810 is a substrate 1804, a cover member and 1805, a sealing agent. A space surrounded by the substrate 1810, the cover member 1804, and the sealing agent 1805 is denoted by 1807.

1808 represents a connection wiring line for transmitting signals that are to be inputted to the source signal line driving circuit 1801 and the gate signal line driving circuit 1803. The connection wiring line 1808 receives video signals and clock signals from an FPC (flexible printed circuit) 1809 that serves as an external input terminal. The FPC alone is shown in the drawing but a printed wiring board (PWB) may be attached to the FPC. In this specification, a light emitting device refers to a light emitting device itself plus an FPC, or plus an FPC and a PWB.

The sectional structure is described next with reference to FIG. 18B. The driving circuits and the pixel portion are formed on the substrate 1810. In FIG. 18B, one of the driving circuits, namely, the source signal line driving circuit 1801, and the pixel portion 1802 are shown.

The source signal line driving circuit 1801 here is a CMOS circuit having an n-channel TFT 1813 and a p-channel TFT 1814 in combination. The TFT that forms the driving circuit can be any known CMOS circuit, PMOS circuit, or NMOS circuit. This embodiment employs a driver-integrated substrate in which driving circuits are formed on a substrate, but instead the driving circuits may be external to the substrate.

The pixel portion 1802 is composed of a plurality of pixels each of which includes a current controlling TFT 1811 and an anode 1812. The anode 1812 is electrically connected to a drain of the current controlling TFT 1811.

The anode 1812 has a slit. An insulator 1815 is formed on each end of the anode 1812. An organic compound layer 1817 is formed on the anode 1812. The organic compound layer 1817 is composed of a hole injection layer 1816, a hole generating layer, a hole transporting layer, a light emitting layer, and an electron transporting layer. A cathode 1818 is formed on the insulator 1815 and the organic compound layer 1816. A light emitting element 1819 composed of the anode, the organic compound layer, and the cathode is thus completed.

The cathode 1818 also functions as a wiring line common to all pixels and is electrically connected to the FPC 1809 through the connection Wiring line 1808.

The cover member 1804 is bonded to the substrate 1810 with the sealing agent 1805 to seal the light emitting element 1819 formed on the substrate 1810. Spacers formed from a resin film may be provided to keep the distance between the cover member 1804 and the light emitting element 1819. The space 1807 inside the sealing agent 1805 is filled with inert gas such as nitrogen. The sealing agent 1805 is preferably an epoxy resin. Desirably, the material of the sealing agent 1805 is one that allows as small amount of moisture and oxygen as possible to transmit. A substance having a hygroscopic effect or a substance having an antioxidizing effect may be put in the space 1807.

In this embodiment, the material of the cover member 1804 can be a glass substrate, a quartz substrate, and a plastic substrate that is formed of FRP (fiberglass-reinforced plastics), PVF (polyvinyl floride), Mylar, polyester, acrylic, or the like.

After the cover member 1804 is bonded using the sealing agent 1805, the side faces (exposed faces) of the device may be further covered and sealed by the sealing agent.

By sealing the light emitting element in the space 1807 as described above, the light emitting element can be shut off completely of the outside and external substances that accelerate degradation of the organic compound layer, such as moisture and oxygen, can be prevented from entering the light emitting element. Accordingly, a highly reliable light emitting device can be obtained.

Embodiment 10

Figure 19A:
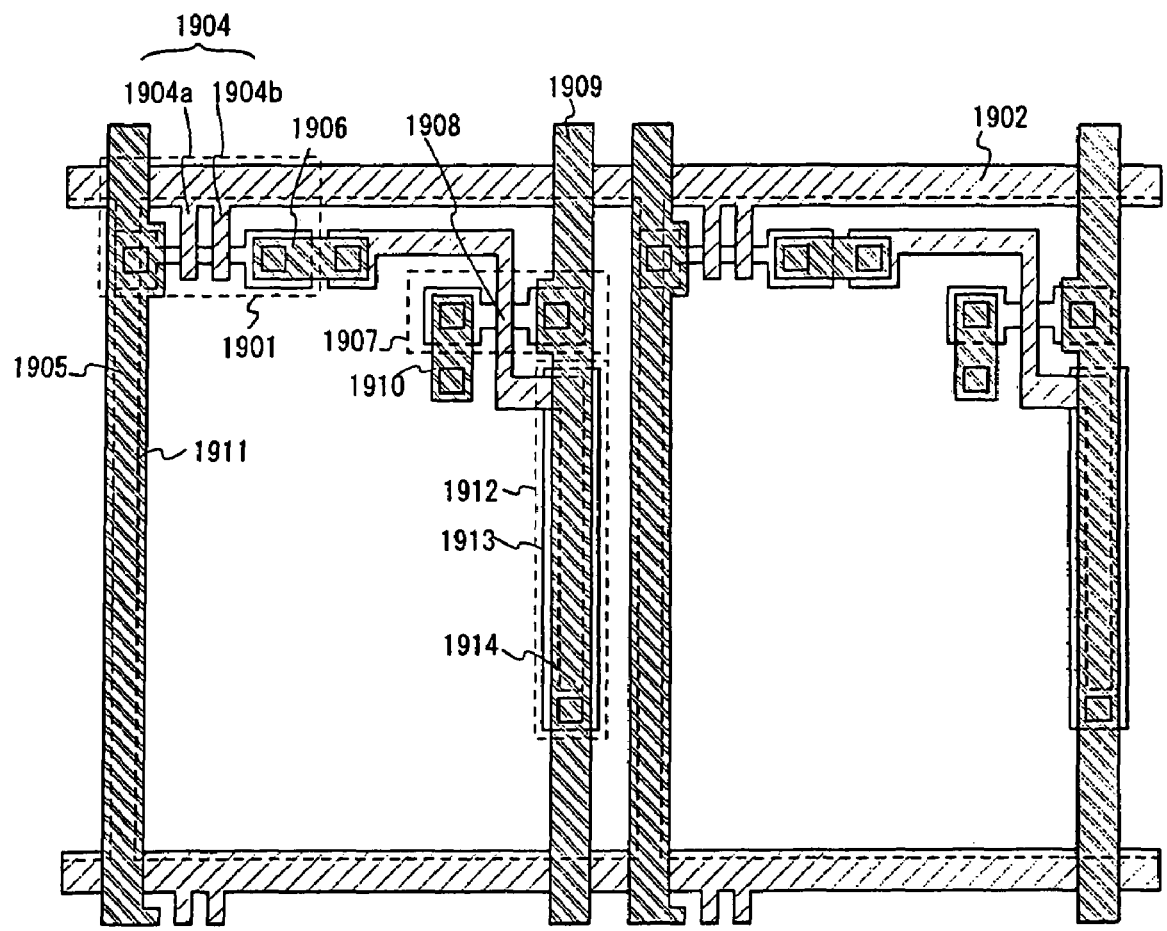
FIGS. 19A and 19B are top views of pixels.
Figure 19B:
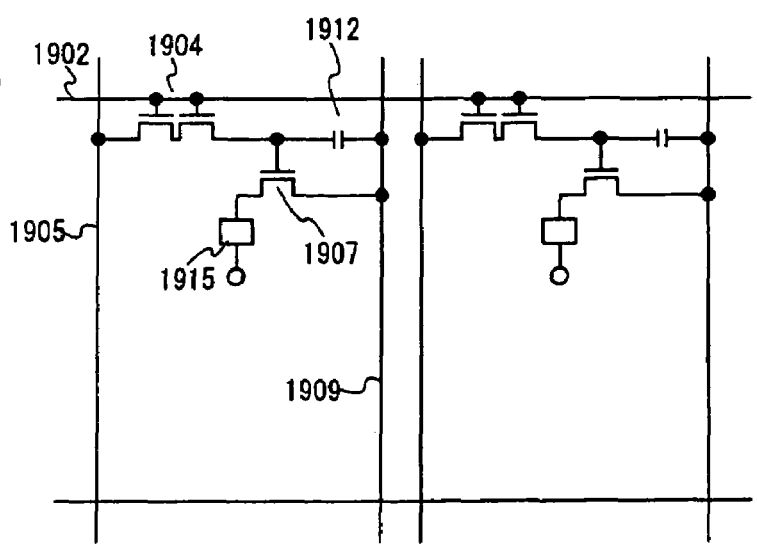

A light emitting device of the present invention may have a pixel portion shown in FIG. 19A. The circuit structure in FIG. 19A is shown in FIG. 19B.

In FIG. 19A, reference symbol 1901 denotes a switching TFT, which is an n-channel TFT. A wiring line denoted by 1902 is a gate wiring line that electrically connects gate electrodes 1904 (1904a and 1904b) of the switching TFT 1901.

In this embodiment, the switching TFT has a double gate structure in which two channel formation regions are formed. However, a single gate structure in which one channel formation region is formed or a triple gate structure in which three channel formation regions are formed may be employed instead.

A source of the switching TFT 1901 is connected to a source wiring line 1905. A drain of the switching TFT 1901 is connected to a drain wiring line 1906. The drain wiring line 1906 is electrically connected to a gate electrode 1908 of a current controlling TFT 1907. The current controlling TFT 1907 is a p-channel TFT. The current controlling TFT in this embodiment has a single gate structure but it may take a double gate structure or a triple gate structure.

In this embodiment, the switching TFT 1901 is an n-channel TFT and the current controlling TFT 1907 is a p-channel TFT. Alternatively, a p-channel TFT may be used for the switching TFT 1901 while an n-channel TFT is used for the current controlling TFT 1907, or 1901 and 1907 may be both n-channel TFTs, or 1901 and 1907 may be both p-channel TFTs.

A source of the current controlling TFT 1907 is electrically connected to a current supply line 1909. A drain of the current controlling TFT 1907 is electrically connected to a drain wiring line 1910. The drain wiring line 1910 is also electrically connected to an electrode (anode) 1911 indicated by the dotted line. An organic compound layer is formed on the electrode (anode) 1911 and an electrode (cathode) is formed thereon to complete a light emitting element 1915 shown in FIG. 19B.

A storage capacitor (capacitor) is formed in a region denoted by 1912. The capacitor 1912 is formed among a semiconductor film 1913, an insulating film (not shown) on the same layer as a gate insulating film, and a capacitor electrode 1914. The semiconductor film 1913 is electrically connected to the current supply line 1909. The capacitor electrode 1914 is electrically connected to the gate electrode 1908. A capacitor formed from the capacitor electrode 1914, the same layer (not shown) as an interlayer insulating film, and the current supply line 1909 can also be used as a storage capacitor.

The pixel portion structure described in this embodiment can replace the pixel portion structure of Embodiment 1.

It is also possible in this embodiment to manufacture an element substrate by forming a pixel portion and TFTs (n-channel TFTs and p-channel TFTs) of driving circuits to be placed in the periphery of the pixel portion on the same substrate at the same time and forming in the pixel portion light emitting elements that are electrically connected to TFTs.

Embodiment 11

Embodiment 8 shows an example in which a light emitting element emits light downward through a substrate. Described in this embodiment with reference to FIGS. 20A and 20B is an example in which a light emitting element emits light upward.

A substrate 2000 in this embodiment is a glass substrate. However, a quartz substrate, a silicon substrate, a metal substrate, or a ceramic substrate may be used instead.

Figure 20A:
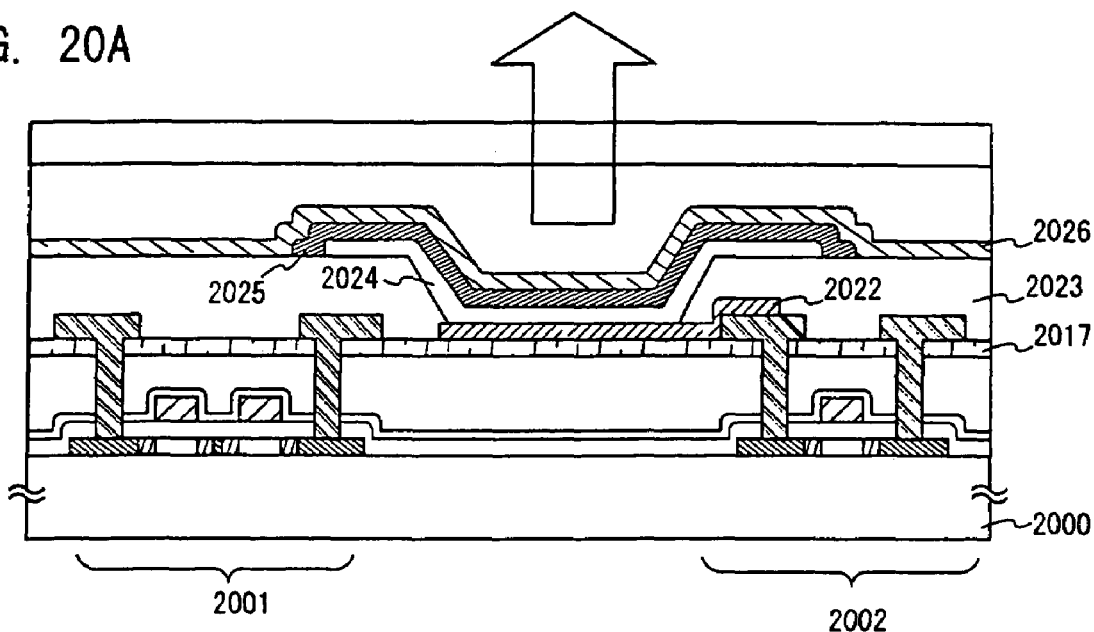
FIGS. 20A and 20B are diagrams showing a light emitting device.

In FIG. 20A, the active layer of each TFT has at least a channel formation region, a source region, and a drain region. The active layer of each TFT is covered with a gate insulating film. A gate electrode is formed to overlap the channel formation region with the gate insulating film interposed therebetween. The gate electrode is covered with an interlayer insulating film. Electrodes electrically connected to the source regions and drain regions of the TFTs respectively are formed on the interlayer insulating film. A cathode 2022 is electrically connected to a current controlling TFT 2002 that is an n-channel TFT. An insulating layer 2023 having an opening and a tapered edge is formed so as to cover an end of the cathode 2022. An organic compound layer consisting of a light emitting layer 2024 and a hole injection layer 2025 is formed on the cathode 2022. An anode 2026 is formed on the organic compound layer to complete a light emitting element. The light emitting element is sealed by a cover member with a space left between the light emitting element and the cover member.

Figure 20B:
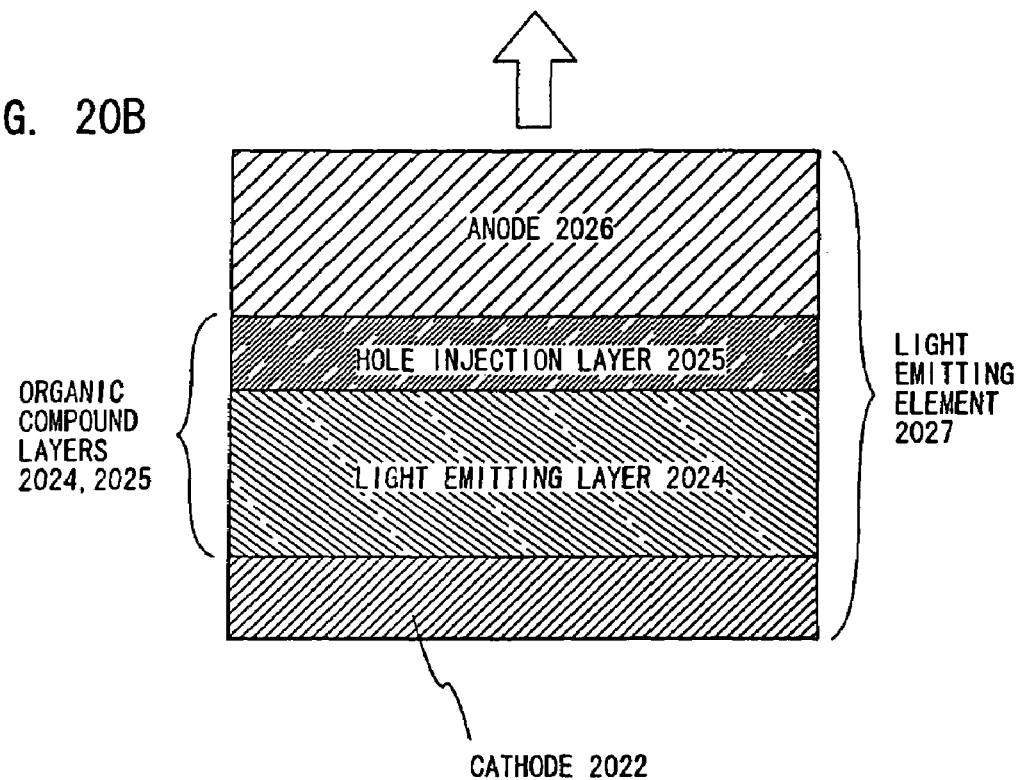

The light emitting layer 2024 and hole injection layer 2025 of this embodiment which are shown in FIG. 20B are formed in accordance with Embodiment Mode.

Following the description in Embodiment 8, electrodes electrically connected to the source regions and drain regions of the TFTs respectively are formed on the interlayer insulating film. Then, the cathode 2022 is formed. The cathode is desirably formed from Al having a small work function or from an aluminum alloy such as Al—Li. A transparent conductive film is used for the anode. The transparent conductive film is formed from a compound of indium oxide and tin oxide (called ITO), a compound of indium oxide and zinc oxide tin oxide alone, or zinc oxide alone.

The insulating layer 2023 having an opening and a tapered edge is formed so as to cover an end of the cathode 2022. Then, the light emitting layer 2024 is formed on the cathode 2022 by the method shown in Embodiment Mode. The dispersion solution of Embodiment 8 is ejected from a nozzle (not shown), with nitrogen gas to form the light emitting layer 2024.

Copper phthalocyanine (CuPc) is formed into a film with a thickness of 20 nm by vacuum evaporation to serve as the hole injection layer 2025.

The anode 2026 is formed next to complete a light emitting element 2027 that is composed of the anode 2026, the organic compound layer (the light emitting layer 2024 and the hole injection layer 2025), and the cathode 2022.

This embodiment thus provides a light emitting device having a light emitting element in which light generated in the organic compound layer travels in the direction indicated by the arrow in FIGS. 20A and 20B to be taken out of the device.

Embodiment 12

The light emitting devices of the present invention, which have been described in the embodiments above have advantage of low price. Accordingly, electric appliances that include those light emitting devices as their display units have advantages (thinness/lightness, high responsibility and low voltage driving) of characteristics of an organic light emitting element. Moreover, the electric appliances can be offered at lower price than conventional ones. The electric appliances have plenty of coloring variations.

The light emitting device is self-luminous to eliminate the need for back light as the one in liquid crystal displays, and has an organic compound film whose thickness is less than 1 µm. Therefore, the light emitting device can be made thin and light-weight. Electric appliances that include the light emitting device as their display units are accordingly thinner and lighter than conventional ones. This too leads directly to conveniences (lightness and compactness in carrying them around) and is very useful particularly for portable equipment and like other electric appliances. Moreover, being thin (un-voluminous) is doubtlessly useful for all of the electric appliances in terms of transportation (a large number of appliances can be transported in a mass) and installation (space-saving).

Being self-luminous, the light emitting device is characterized by having better visibility in bright places than liquid crystal display devices and wide viewing angle. Therefore electric appliances that include the light emitting device as their display units are advantageous also in terms of easiness in viewing display.

To summarize, electric appliances that use a light emitting device of the present invention have, in addition to merits of conventional organic light emitting elements, namely, thinness/lightness and high visibility, new features of low price and plenty of coloring variations and therefore are very useful.

Given as examples of electric equipment employing a light emitting device of the present invention is applied are: a video camera; a digital camera; a goggle type display (head mounted display); a navigation system; an audio reproducing device (car audio, an audio component, and the like); a notebook computer; a game machine: a portable information terminal (a mobile computer, a cellular phone, a portable came machine, an electronic book. etc.); and an image reproducing device (specifically, a device capable of processing data in a recording medium such as a digital versatile disk (DVD) and having a display device that can display the image of the data). The light emitting device having a light emitting element is desirable particularly for a portable information terminal since its screen is often viewed obliquely and is required to have a wide viewing angle.

This embodiment shows examples of the electric appliances that include display units as the light emitting device of the present invention. Specific examples thereof are shown in FIGS. 12A to 13B. The organic light emitting element included in the electric appliance of this embodiment can be any element according to the present invention. The light emitting device included in the electric appliance of this embodiment can have any of the configurations illustrated in the present specification.

FIG. 12A shows a display device, which is composed of a case 2101, a support base 2102, a display unit 2103, a speaker unit 2104 and a video input terminal 2105. The light emitting device of the present invention can be used to the display unit 2103. The light emitting device having a light emitting element is self-luminous and does not need a backlight, so that it can make a thinner display unit than liquid display devices can. The term display device includes every display device for displaying information such as one for a personal computer, one for receiving TV broadcasting, and one for advertisement. In addition, the display shown in FIG. 12A is small and medium type or large type, for example, 5 to 20 inches screen display. Moreover, it is preferable to mass-produce by performing a multiple pattern using 1×1 m substrate to form such sized display section.

FIG. 12B illustrated a digital still camera which includes a main body 2201, a display portion 2202, an image receiving portion 2203, an operation key 2204, an external connection port 2205, a shutter 2206, or the like. The light emitting device in accordance with the present invention can be used as the display portion 2202.

FIG. 12C illustrates a lap-top computer which includes a main body 2301, a casing 2302, a display portion 2303, a keyboard 2304, an external connection port 2305, a pointing mouse 2306, or the like. The light emitting device in accordance with the present invention can be used as the display portion 2303.

FIG. 12D illustrated a personal computer which includes a main body 2401, a display portion 2402, a switch 2403, an operation key 2404, an infrared port 2405, or the like. The light emitting device in accordance with the present invention can be used as the display portion 2402.

FIG. 12E illustrates a portable image reproduction apparatus including a recording medium (more specifically, a DVD reproduction apparatus), which includes a main body 2501, a casing 2502, a display portion A 2503, another display portion B 2504, a recording medium (DVD or the like) reading portion 2505, an operation key 2506, a speaker portion 2507 or the like. The display portion A 2503 is used mainly for displaying image information, while the display portion B 2504 is used mainly for displaying character information. The light emitting device in accordance with the present invention can be used as these display portions A 2503 and B 2504. The image reproduction apparatus including a recording medium further includes a game machine or the like.

FIG. 12F illustrates a goggle type display (head mounted display) which includes a main body 2601, a display portion 2602, and portion 2603 or the like. The light emitting device in accordance with the present invention can be used as the display portion 2602.

FIG. 12G illustrates a video camera which includes a main body 2701, a display portion 2702, a casing 2703, an external connecting port 2704, a remote control receiving portion 2705, an image receiving portion 2706, a battery 2707, a sound input portion 2708, an operation key 2709, or the like. The light emitting device in accordance with the present invention can be used as the display portion 2702.

FIG. 12H illustrates a mobile telephone which includes a main body 2801, a casing 2802, a display portion 2803, a sound input portion 2804, a sound output portion 2805, an operation key 2806, an external connecting port 2807, an antenna 2808, or the like. The light emitting device in accordance with the present invention can be used as the display portion 2803. Note that the display portion 2803 can reduce power consumption of the mobile telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic appliances are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information. e.g. a display portion of a portable information terminal, and more particular, a portable telephone or a sound reproduction device, it is desirable to drive the light emitting device so that the character information is formed by a light emitting portion while a non-emission portion corresponds to the background.

Figure 13A:
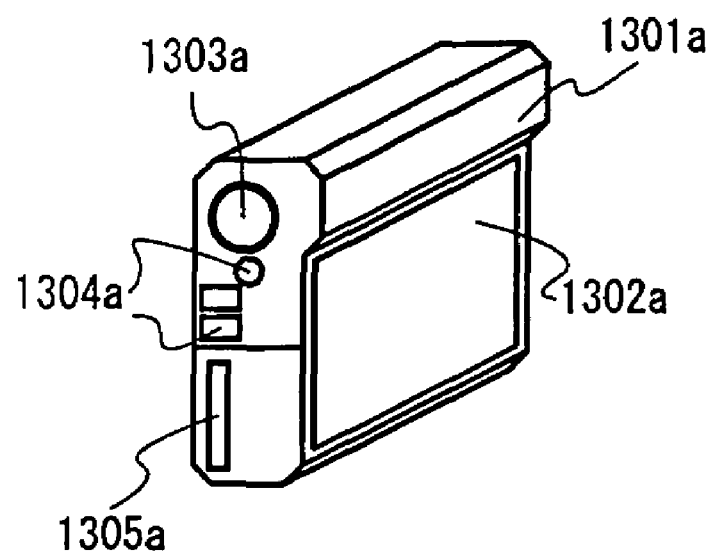
FIGS. 13A and 13B are diagrams showing specific examples of an electric appliance.

FIG. 13A shows a portable (mobile) computer, which is composed of a main body 1301a, a display unit 1302a, an image input unit 1303a, operation switches 1304a, and a memory slot 1305a. By using a light emitting device of the present invention as the display unit 1302a, the portable (mobile) computer can be thin and light-weight, and display various coloring. In addition, the portable computer can reproduce information and record the information onto a record medium in which flush memory and nonvolatile memory are accumulated.

Figure 13B:
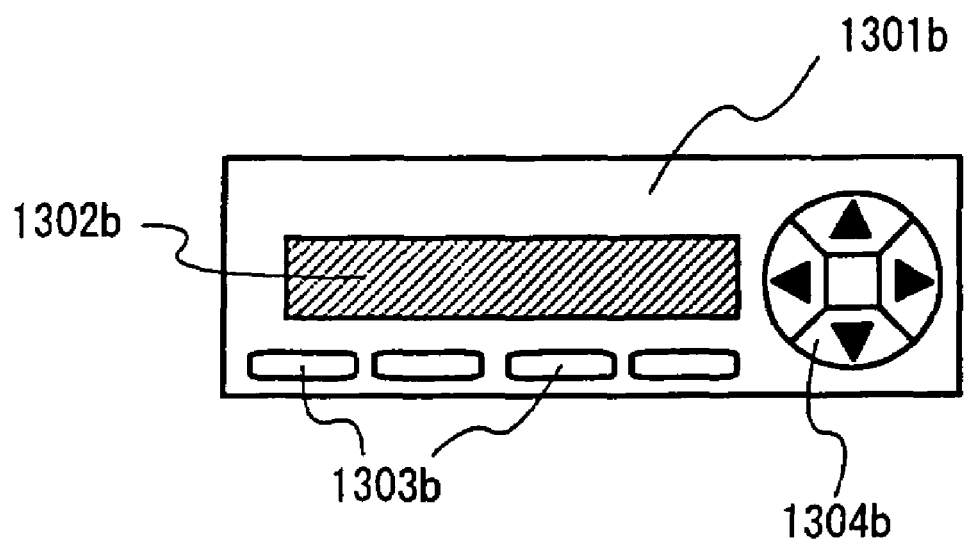

FIG. 13B shows audio (specifically, car audio); which is composed of a main body 1301b, a display unit 1302b, and operation switches 1303b and 1304b. By using a light emitting device of the present invention as the display unit 1302b, the audio can be offered at low price and light-weight. Although car audio is taken as an example in this embodiment, the audio may be home audio.

It is effective to give the electric appliances shown in FIGS. 12A to 13B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the light emitting device of the present invention are also thin and light weight and can operate consuming less power, which makes them very useful appliances. Light sources of liquid crystal display devices, such as back light or front light, or light sources of lighting fixtures are typical uses of the light emitting device of the present invention as a light source.

When liquid crystal displays are used as the display units of the electric appliances shown in FIGS. 12A to 13B according to this embodiment, the electric appliances can be thin and light-weight and consume less power if those liquid crystal displays use as back light or front light the light emitting device of the present invention.

Organic light emitting elements which emit light of various colors and which can be manufactured at low cost are obtained by carrying out the present invention. Furthermore, by using the organic light emitting elements, a less expensive light emitting device which is more varied in color of emitted light than prior art can be obtained. Also, an electric appliance using the light emitting device is provided.

What is claimed is:

1. A passive matrix light emitting device comprising:
   a light emitting element, the light emitting element comprising:
   a scanning line;
   a data line; and
   an organic compound layer sandwiched between the scanning line and the data line, the organic compound layer comprising at least one host material and at least one guest material, and the host material and the guest material including an organic compound,
   wherein the host material forms an amorphous film and the guest material is scattered in the amorphous film in the form of granules which are aggregations of material molecules, the granules having a diameter smaller than a thickness of the organic compound layer, and
   wherein the host material is soluble in an organic solvent and the guest material is insoluble in the organic solvent.

2. The passive matrix light emitting device according to claim 1, wherein the guest material is a luminous material.

3. The passive matrix light emitting device according to claim 1, wherein the guest material is a material that emits light when returning from triplet excitation.

4. The passive matrix light emitting device according to claim 1, wherein the host material is a material which is a high molecular weight material.

5. The passive matrix light emitting device according to claim 1, wherein the guest material comprises at least one selected from the group consisting of a pigment, a condensed polycyclic organic compound, an orthometal complex of iridium, and a conjugate polymer having no substituent.

6. The passive matrix light emitting device according to claim 1, wherein the guest material comprises at least one selected from the group consisting of Qd, CuPc, BCP, Ir(ppy)3, PPV, PNV, Phenyl-PPV, PT, PPT, PPP, and PF.

7. The passive matrix light emitting device according to claim 1, wherein the host material comprises at least one selected from the group consisting of RO-PPV and PVK.

8. The passive matrix light emitting device according to claim 1, wherein the host material comprises at least one selected from the group consisting of a conjugate polymer having a substituent, a pendant polymer having a conjugate material for its side chain, and a low molecular weight material soluble in solvents.

9. The passive matrix light emitting device according to claim 1, wherein the organic compound layer is formed by applying a solution including the host material and the guest material by spin coating.

10. An electric appliance comprising the passive matrix light emitting device of claim 1, wherein the electric appliance is selected from the group consisting of a video camera, a digital still camera, a lap-top computer, a personal computer, a goggle type display, a mobile telephone, a navigation system, an audio reproducing device, a portable computer, a game machine, a portable information terminal, and an image reproducing apparatus.

11. A passive matrix light emitting device comprising:
   a light emitting element, the light emitting element comprising:
   a scanning line;
   a data line; and
   an organic compound layer placed between the scanning line and the data line, the organic compound layer comprising at least a first organic compound and a second organic compound,
   wherein the first organic compound forms an amorphous film and the second organic compound is scattered in the amorphous film in the form of granules which are aggregations of material molecules, the granules having a diameter smaller than a thickness of the organic compound layer, and
   wherein the first organic compound is soluble in a solvent and the second organic compound is insoluble in the solvent.

12. The passive matrix light emitting device according to claim 11, wherein the second organic compound emits fluorescent light or phosphorescent light.

13. The passive matrix light emitting device according to claim 11, wherein the organic compound layer has a thickness of 1 nm or more and 1 µm or less.

14. The passive matrix light emitting device according to claim 11, wherein the second organic compound comprises at least one selected from the group consisting of a pigment, a condensed polycyclic organic compound, an orthometal complex of iridium, and a conjugate polymer having no substituent.

15. The passive matrix light emitting device according to claim 11, wherein the second organic compound comprises at least one selected from the group consisting of Qd, CuPc, BCP, Ir(ppy)3, PPV, PNV, Phenyl-PPV, PT, PPT, PPP, and PF.

16. The passive matrix light emitting device according to claim 11, wherein the first organic compound comprises at least one selected from the group consisting of RO-PPV and PVK.

17. The passive matrix light emitting device according to claim 11, wherein the first organic compound comprises at least one selected from the group consisting of a conjugate polymer having a substituent, a pendant polymer having a conjugate material for its side chain, and a low molecular weight material soluble in solvents.

18. The passive matrix light emitting device according to claim 11, wherein the organic compound layer is formed by applying a solution including the first organic compound and the second organic compound by spin coating.

19. An electric appliance comprising the passive matrix light emitting device of claim 11, wherein the electric appliance is selected from the group consisting of a video camera, a digital still camera, a lap-top computer, a personal computer, a goggle type display, a mobile telephone, a navigation system, an audio reproducing device, a portable computer, a game machine, a portable information terminal, and an image reproducing apparatus.

20. A passive matrix light emitting device comprising:
a scanning line;
a data line;
a bank which separates the data line; and
an organic compound layer sandwiched between the scanning line and the data line, the organic compound layer comprising at least one host material and at least one guest material, and the host material and the guest material including an organic compound,
wherein the host material forms an amorphous film and the guest material is scattered in the amorphous film in the form of granules which are aggregations of material molecules, the granules having a diameter smaller than a thickness of the organic compound layer, and
wherein the host material is soluble in an organic solvent and the guest material is insoluble in the organic solvent.

21. The passive matrix light emitting device according to claim 20, wherein the guest material is a luminous material.

22. The passive matrix light emitting device according to claim 20, wherein the guest material is a material that emits light when returning from triplet excitation.

23. The passive matrix light emitting device according to claim 20, wherein the host material is a material which is a high molecular weight material.

24. The passive matrix light emitting device according to claim 20, wherein the guest material comprises at least one selected from the group consisting of a pigment, a condensed polycyclic organic compound, an orthometal complex of iridium, and a conjugate polymer having no substituent.

25. The passive matrix light emitting device according to claim 20, wherein the guest material comprises at least one selected from the group consisting of Qd, CuPc, BCP, Ir(ppy)3, PPV, PNV, Phenyl-PPV, PT, PPT, PPP, and PF.

26. The passive matrix light emitting device according to claim 20, wherein the host material comprises at least one selected from the group consisting of RO-PPV and PVK.

27. The passive matrix light emitting device according to claim 20, wherein the host material comprises at least one selected from the group consisting of a conjugate polymer having a substituent, a pendant polymer having a conjugate material for its side chain, and a low molecular weight material soluble in solvents.

28. The passive matrix light emitting device according to claim 20, wherein the organic compound layer is formed by applying a solution including the host material and the guest material by spin coating.

29. An electric appliance comprising the passive matrix light emitting device of claim 20, wherein the electric appliance is selected from the group consisting of a video camera, a digital still camera, a lap-top computer, a personal computer, a goggle type display, a mobile telephone, a navigation system, an audio reproducing device, a portable computer, a game machine, a portable information terminal, and an image reproducing apparatus.

30. A passive matrix light emitting device comprising:
a scanning line;
a data line;
a bank which separates the data line; and
an organic compound layer placed between the scanning line and the data line, the organic compound layer comprising at least a first organic compound and a second organic compound,
wherein the first organic compound forms an amorphous film and the second organic compound is scattered in the amorphous film in the form of granules which are aggregations of material molecules, the granules having a diameter smaller than a thickness of the organic compound layer, and
wherein the first organic compound is soluble in a solvent and the second organic compound is insoluble in the solvent.

31. The passive matrix light emitting device according to claim 30, wherein the second organic compound emits fluorescent light or phosphorescent light.

32. The passive matrix light emitting device according to claim 30, wherein the organic compound layer has a thickness of 1 nm or more and 1 µm or less.

33. The passive matrix light emitting device according to claim 30, wherein the second organic compound comprises at least one selected from the group consisting of a pigment, a condensed polycyclic organic compound, an orthometal complex of iridium, and a conjugate polymer having no substituent.

34. The passive matrix light emitting device according to claim 30, wherein the second organic compound comprises at least one selected from the group consisting of Qd, CuPc, BCP, Ir(ppy)3, PPV, PNV, Phenyl-PPV, PT, PPT, PPP, and PF.

35. The passive matrix light emitting device according to claim 30, wherein the first organic compound comprises at least one selected from the group consisting of RO-PPV and PVK.

36. The passive matrix light emitting device according to claim 30, wherein the first organic compound comprises at least one selected from the group consisting of a conjugate polymer having a substituent, a pendant polymer having a conjugate material for its side chain, and a low molecular weight material soluble in solvents.

37. The passive matrix light emitting device according to claim 30, wherein the organic compound layer is formed by applying a solution including the first organic compound and the second organic compound by spin coating.

38. An electric appliance comprising the passive matrix light emitting device of claim 30, wherein the electric appliance is selected from the group consisting of a video camera, a digital still camera, a lap-top computer, a personal computer, a goggle type display, a mobile telephone, a navigation system, an audio reproducing device, a portable computer, a game machine, a portable information terminal, and an image reproducing apparatus.

* * * * *